(12) United States Patent
Chaichanavong et al.

(10) Patent No.: US 7,752,523 B1
(45) Date of Patent: Jul. 6, 2010

(54) REDUCED-COMPLEXITY DECODING OF PARITY CHECK CODES

(75) Inventors: Panu Chaichanavong, Mountain View, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 933 days.

(21) Appl. No.: 11/582,014

(22) Filed: Oct. 16, 2006

Related U.S. Application Data

(60) Provisional application No. 60/772,756, filed on Feb. 13, 2006, provisional application No. 60/830,045, filed on Jul. 10, 2006.

(51) Int. Cl.
*H03M 13/00* (2006.01)

(52) U.S. Cl. .................. 714/755; 714/786; 714/792; 714/794; 714/795; 714/796; 714/780; 375/262; 375/341

(58) Field of Classification Search ................ 714/780, 714/791–792, 794–796, 755, 786; 375/262, 375/341
See application file for complete search history.

(56) References Cited

U.S. PATENT DOCUMENTS

| | | | |
|---|---|---|---|
| 6,615,385 B1 * | 9/2003 | Kim et al. ................... | 714/758 |
| 7,075,970 B2 * | 7/2006 | Maru ......................... | 375/140 |
| 2008/0046799 A1 * | 2/2008 | Geller et al. ................ | 714/777 |

OTHER PUBLICATIONS

Jinghu Chen, et al. "Reduced-Complexity Decoding of LDPC Codes", IEEE Transactions on Communications, vol. 53, No. 8, pp. 1288-1299, Aug. 2005.
Barnault, L. et al., "Fast Decoding Algorithm for LDPC over GF $(2^q)$", IEEE, pp. 70-73, Apr. 4, 2003.
Matthew C. Davey et al., "Low-Density Parity Check Codes over GF(q)", IEEE Communications Letters, vol. 2, No. 6, pp. 165-167, Jun. 1998.
David Declercq et al., "Extended MinSum Algorithm for Decoding LDPC Codes over GF(q)".
Henk Wymeersch et al., "Log-domain decoding of LDPC codes over GF(q)", EEE Communications Society, 2004.

\* cited by examiner

*Primary Examiner*—Guy J Lamarre

(57) ABSTRACT

The disclosed technology provides a less resource intensive way to decode a parity check code using a modified min-sum algorithm. For a particular parity check constraint that includes n variable nodes, an LDPC decoder can compute soft information for one of the variable nodes based on combinations of soft information from other variable nodes, wherein each combination includes soft information from at most a number d of other variable nodes. In one embodiment, soft information from one of the other variable nodes is used in a combination only if it corresponds to a non-most-likely value for the other variable node.

42 Claims, 17 Drawing Sheets

| $v_1$ | $v_2$ | $v_3$ | $v_4$ | $v_5$ |
|---|---|---|---|---|
| 0 | 0 | 0 | 0 | 0 |
| 0 | 0 | 1 | 2 | 1 |
| 0 | 0 | 2 | 3 | 2 |
| 0 | 0 | 3 | 1 | 3 |
| 0 | 1 | 0 | 3 | 1 |
| 0 | 1 | 1 | 1 | 0 |
| 0 | 1 | 2 | 0 | 3 |
| 0 | 1 | 3 | 2 | 2 |
| 0 | 2 | 0 | 1 | 2 |
| 0 | 2 | 1 | 3 | 3 |
| 0 | 2 | 2 | 2 | 0 |
| 0 | 2 | 3 | 0 | 1 |
| 0 | 3 | 0 | 2 | 3 |
| 0 | 3 | 1 | 0 | 2 |
| 0 | 3 | 2 | 1 | 1 |
| 0 | 3 | 3 | 3 | 0 |
| 1 | 0 | 0 | 2 | 3 |
| 1 | 0 | 1 | 0 | 2 |
| 1 | 0 | 2 | 1 | 1 |
| 1 | 0 | 3 | 3 | 0 |
| 1 | 1 | 0 | 1 | 2 |
| 1 | 1 | 1 | 3 | 3 |
| 1 | 1 | 2 | 2 | 0 |
| 1 | 1 | 3 | 0 | 1 |
| 1 | 2 | 0 | 3 | 1 |
| 1 | 2 | 1 | 1 | 0 |
| 1 | 2 | 2 | 0 | 3 |
| 1 | 2 | 3 | 2 | 2 |
| 1 | 3 | 0 | 0 | 0 |
| 1 | 3 | 1 | 2 | 1 |
| 1 | 3 | 2 | 3 | 2 |
| 1 | 3 | 3 | 1 | 3 |

| $v_1$ | $v_2$ | $v_3$ | $v_4$ | $v_5$ |
|---|---|---|---|---|
| 2 | 0 | 0 | 3 | 1 |
| 2 | 0 | 1 | 1 | 0 |
| 2 | 0 | 2 | 0 | 3 |
| 2 | 0 | 3 | 2 | 2 |
| 2 | 1 | 0 | 0 | 0 |
| 2 | 1 | 1 | 2 | 1 |
| 2 | 1 | 2 | 3 | 2 |
| 2 | 1 | 3 | 1 | 3 |
| 2 | 2 | 0 | 2 | 3 |
| 2 | 2 | 1 | 0 | 2 |
| 2 | 2 | 2 | 1 | 1 |
| 2 | 2 | 3 | 3 | 0 |
| 2 | 3 | 0 | 1 | 2 |
| 2 | 3 | 1 | 3 | 3 |
| 2 | 3 | 2 | 2 | 0 |
| 2 | 3 | 3 | 0 | 1 |
| 3 | 0 | 0 | 1 | 2 |
| 3 | 0 | 1 | 3 | 3 |
| 3 | 0 | 2 | 2 | 0 |
| 3 | 0 | 3 | 0 | 1 |
| 3 | 1 | 0 | 2 | 3 |
| 3 | 1 | 1 | 0 | 2 |
| 3 | 1 | 2 | 1 | 1 |
| 3 | 1 | 3 | 3 | 0 |
| 3 | 2 | 0 | 0 | 0 |
| 3 | 2 | 1 | 2 | 1 |
| 3 | 2 | 2 | 3 | 2 |
| 3 | 2 | 3 | 1 | 3 |
| 3 | 3 | 0 | 3 | 1 |
| 3 | 3 | 1 | 1 | 0 |
| 3 | 3 | 2 | 0 | 3 |
| 3 | 3 | 3 | 2 | 2 |

FIG. 4A

| $v_1$ | $v_2$ | $v_3$ | $v_4$ |
|---|---|---|---|
| 0 | 0 | 0 | 0 |
| 0 | 0 | 1 | 2 |
| 0 | 0 | 2 | 3 |
| 0 | 0 | 3 | 1 |
| 0 | 1 | 0 | 3 |
| 0 | 1 | 1 | 1 |
| 0 | 1 | 2 | 0 |
| 0 | 1 | 3 | 2 |
| 0 | 2 | 0 | 1 |
| 0 | 2 | 1 | 3 |
| 0 | 2 | 2 | 2 |
| 0 | 2 | 3 | 0 |
| 0 | 3 | 0 | 2 |
| 0 | 3 | 1 | 0 |
| 0 | 3 | 2 | 1 |
| 0 | 3 | 3 | 3 |
| 1 | 0 | 0 | 2 |
| 1 | 0 | 1 | 0 |
| 1 | 0 | 2 | 1 |
| 1 | 0 | 3 | 3 |
| 1 | 1 | 0 | 1 |
| 1 | 1 | 1 | 3 |
| 1 | 1 | 2 | 2 |
| 1 | 1 | 3 | 0 |
| 1 | 2 | 0 | 3 |
| 1 | 2 | 1 | 1 |
| 1 | 2 | 2 | 0 |
| 1 | 2 | 3 | 2 |
| 1 | 3 | 0 | 0 |
| 1 | 3 | 1 | 2 |
| 1 | 3 | 2 | 3 |
| 1 | 3 | 3 | 1 |

| $v_1$ | $v_2$ | $v_3$ | $v_4$ |
|---|---|---|---|
| 2 | 0 | 0 | 3 |
| 2 | 0 | 1 | 1 |
| 2 | 0 | 2 | 0 |
| 2 | 0 | 3 | 2 |
| 2 | 1 | 0 | 0 |
| 2 | 1 | 1 | 2 |
| 2 | 1 | 2 | 3 |
| 2 | 1 | 3 | 1 |
| 2 | 2 | 0 | 2 |
| 2 | 2 | 1 | 0 |
| 2 | 2 | 2 | 1 |
| 2 | 2 | 3 | 3 |
| 2 | 3 | 0 | 1 |
| 2 | 3 | 1 | 3 |
| 2 | 3 | 2 | 2 |
| 2 | 3 | 3 | 0 |
| 3 | 0 | 0 | 1 |
| 3 | 0 | 1 | 3 |
| 3 | 0 | 2 | 2 |
| 3 | 0 | 3 | 0 |
| 3 | 1 | 0 | 2 |
| 3 | 1 | 1 | 0 |
| 3 | 1 | 2 | 1 |
| 3 | 1 | 3 | 3 |
| 3 | 2 | 0 | 0 |
| 3 | 2 | 1 | 2 |
| 3 | 2 | 2 | 3 |
| 3 | 2 | 3 | 1 |
| 3 | 3 | 0 | 3 |
| 3 | 3 | 1 | 1 |
| 3 | 3 | 2 | 0 |
| 3 | 3 | 3 | 2 |

FIG. 4B ures, demands for even better information storage and/or communication technologies are also increasing. Advances in this area of technology are apparent in telecommunication and information storage devices, where developments in throughput and storage density are allowing users to process information at much greater rates and quantities than before.

REDUCED-COMPLEXITY DECODING OF PARITY CHECK CODES

CROSS-REFERENCE TO RELATED APPLICATIONS

This application claims the benefit under 35 U.S.C. §119 (e) of U.S. Provisional Application Nos. 60/772,756, filed Feb. 13, 2006, and 60/830,045, filed Jul. 10, 2006, which are hereby incorporated herein by reference in their entirety.

BACKGROUND OF THE INVENTION

This invention relates to parity check codes and, more particularly, to a less resource intensive way for decoding parity check codes using a modified min-sum algorithm.

Electronic information is increasingly being relied upon as a preferred medium for conducting transactions. As a result, demands for even better information storage and/or communication technologies are also increasing. Advances in this area of technology are apparent in telecommunication and information storage devices, where developments in throughput and storage density are allowing users to process information at much greater rates and quantities than before.

To guarantee some degree of information integrity, many communications and storage devices include error-correction technologies. The term "error" as used herein refers to portions of information that have been altered or lost. Error-correction technologies generally involve configuring information in a way that allows the information to be recoverable even when parts of the information are altered or missing. In error-correction, this process of configuring information is referred to as "encoding," and the counterpart process of recovering information is referred to as "decoding." Unless otherwise specified, the term "code" will be used herein to refer to a particular way of encoding and decoding information.

Information to be encoded will be referred to herein as "user information," and the corresponding encoded information will be referred to herein as "coded information." It is contemplated that user information may have already been previously encoded. User information can be grouped into units called "datawords," and coded information can be grouped into units called "codewords." In turn, the datawords and codewords contain symbols, which are groupings of one or more bits. The number of symbols in a dataword is commonly denoted by a variable k, and the number of symbols in a codeword is commonly denoted by a variable n. An encoder generally operates to produce a greater number of codeword symbols than dataword symbols, i.e., generally n>k. A code corresponding to such an encoder is said to have rate-k/n.

One particular type of code is based on a parity check, which is a constraint on the result of a linear sum. For example, suppose a linear sum has the form $c1+c2$, where $c1$ and $c2$ are bits that can each be zero or one. The linear sum is performed in a Galois field $GF(q)$. Since $c1$ and $c2$ can only take on values of zero or one, they are $GF(2)$ variables, and the linear sum is performed in $GF(2)$. A parity check enforces a constraint on the result of $c1+c2$, such as $c1+c2=0$, for example. Using this exemplary parity check in $GF(2)$, it can be seen that the only combinations of $(c1, c2)$ that satisfy the parity check are $(0,0)$ and $(1,1)$. The combinations $(0,1)$ and $(1,0)$ do not satisfy the parity check because their sums equal one (not zero). The combinations that satisfy a parity check are the codewords of the parity check code. Therefore, the parity check code $c1+c2=0$ has two codewords $(0,0)$ and $(1,1)$.

A parity check code can guarantee a certain level of information integrity. For example, using the same example above, the combinations $(0,1)$ and $(1,0)$ are not codewords of the parity check code $c1+c2=0$. Therefore, when coded information includes $(0,1)$ and $(1,0)$, that is an indication that errors have occurred in the coded information. A parity check code decoder can attempt to correct the errors. For example, if a decoder receives information $(0,1)$, the decoder can attempt to determine whether the information more likely corresponds to the codeword $(0,0)$ or the codeword $(1,1)$.

Low-density parity-check (LDPC) codes, a particular class of parity check codes, have superior performance compared to many other types of codes and are widely used in many applications. A LDPC code is a particular type of parity check code in which, generally, there are several parity check constraints and the number of variables in each parity check constraint is relatively small compared to the total number of symbols n in a codeword. Research on parity check code analysis and design often focuses on binary ($GF(2)$) LDPC codes, even though non-binary ($GF(q)$, $q>2$) LDPC codes usually perform better, especially on non-binary channels. This is partly due to the fact that the decoder complexity grows very fast with the field size of the code. Existing decoding algorithms either require complex operations or large memory, which can be undesirable. Accordingly, there is continuing interest in using LDPC codes and in developing practical ways to decode LDPC codes.

SUMMARY OF THE INVENTION

The disclosed technology provides a less resource intensive way to decode parity check codes.

A LDPC code can include a parity check constraint that includes n variable nodes. An LDPC decoder can compute soft information for one of the variable nodes based on the soft information received from the other variable nodes (i.e., co-constraint nodes). The soft information for a variable node can include a metric for the variable node, where the metric takes on a minimum value when the metric corresponds to a most likely value of the variable node.

In accordance with one aspect of the invention, the disclosed technology, for a particular parity check constraint that includes n variable nodes, an LDPC decoder can compute soft information for one of the variable nodes based on combinations of soft information from other variable nodes, wherein each combination includes soft information from at most a number d of other variable nodes. In one embodiment, soft information from one of the other variable nodes is not used in a combination if the soft information corresponds to a most-likely value of the other variable node. In one embodiment, soft information from one of the other variable nodes is used only if it corresponds to a non-most-likely value for the other variable node.

In accordance with one aspect of the invention, the disclosed technology can repeatedly compute soft information for one of the variable nodes based on combinations of soft information from the other variable nodes a pre-determined number of times or until the variable node corresponds to a valid codeword. In some embodiments, the LDPC decoder can compute the soft information for each of the variable nodes n associated with a particular parity check code.

In accordance with one aspect of the invention, the disclosed technology can generate soft information for one of the variable nodes by accessing soft information from the other variable nodes associated with the same parity check code and determining two or more component-wise minima based on the soft information. A combination of the component-wise minima can be formed and used to compute the soft information for the variable node.

In accordance with one aspect of the invention, the disclosed technology can access the soft information from the other variable nodes by receiving a probability distribution function for each of the co-constraint nodes and performing a series of conversions to convert the probability distribution functions into a permuted metric form.

As described above, two or more component-wise minima can be determined based on the soft information. In accordance with one aspect of the invention, the disclosed technology can determine corresponding co-constraint nodes for the two or more component-wise minima. In one embodiment, the determined component-wise minima and their associated co-constraint nodes may be used to form the combination of the component-wise minima. In one embodiment, one or more minima can be determined based on this combination and can be used along with one or more computed sets of permuted variable nodes associated with these minima to compute the soft information for the variable node.

In accordance with one aspect of the invention, a computer program executing on a processor, for a particular parity check constraint that includes n variable nodes, can perform the steps of computing soft information for one of the variable nodes based on combinations of soft information from other variable nodes, wherein each combination includes soft information from at most a number d of other variable nodes. In one embodiment, soft information from one of the other variable nodes is not used in a combination if the soft information corresponds to a most-likely value of the other variable node. In one embodiment, soft information from one of the other variable nodes is used only if it corresponds to a non-most-likely value for the other variable node.

In accordance with one aspect of the invention, a computer program executing on a processor can repeatedly perform the steps of computing soft information for one of the variable nodes based on combinations of soft information from the other variable nodes a pre-determined number of times or until the variable node corresponds to a valid codeword. In some embodiments, computer program executing on a processor can perform the steps of computing the soft information for each of the variable nodes n associated with a particular parity check code.

In accordance with one aspect of the invention, a computer program executing on a processor can perform the steps of generating soft information for one of the variable nodes by accessing soft information from the other variable nodes associated with the same parity check code and determining two or more component-wise minima based on the soft information. A combination of the component-wise minima can be formed and used to compute the soft information for the variable node.

In accordance with one aspect of the invention, a computer program executing on a processor can perform the step of accessing the soft information from the other variable nodes by receiving a probability distribution function for each of the co-constraint nodes and performing a series of conversions to convert the probability distribution functions into a permuted metric form.

As described above, two or more component-wise minima can be determined based on the soft information. In accordance with one aspect of the invention, a computer program executing on a processor can perform the step of determining corresponding co-constraint nodes for the two or more component-wise minima. In one embodiment, the determined component-wise minima and their associated co-constraint nodes may be used to form the combination of the component-wise minima. In one embodiment, one or more minima can be determined based on this combination and can be used along with one or more computed sets of permuted variable nodes associated with these minima to compute the soft information for the variable node.

Further features of the invention, its nature and various advantages, will be more apparent from the accompanying drawings and the following detailed description of the various embodiments.

BRIEF DESCRIPTION OF THE DRAWINGS

FIG. 4A is a table showing the codewords of the LDPC code of FIG. 2;

FIG. 4B is a table showing the codewords that are part of parity constraint "a" from FIG. 2;

DETAILED DESCRIPTION

The disclosed technology provides a less resource intensive way of decoding parity check codes. As used herein, the term "information" will refer to sequences of binary digits that may be physically embodied in many ways that are known in the art. As used herein, information to be encoded will be referred to as "user information," and information produced by an encoder based on user information will be referred to as "coded information." User information may include information that has already been encoded by some type of encoder. User information can be grouped into units called "datawords," and coded information can be grouped into units called "codewords." In turn, the datawords and codewords contain symbols, which are groupings of one or more bits.

Figure 1:
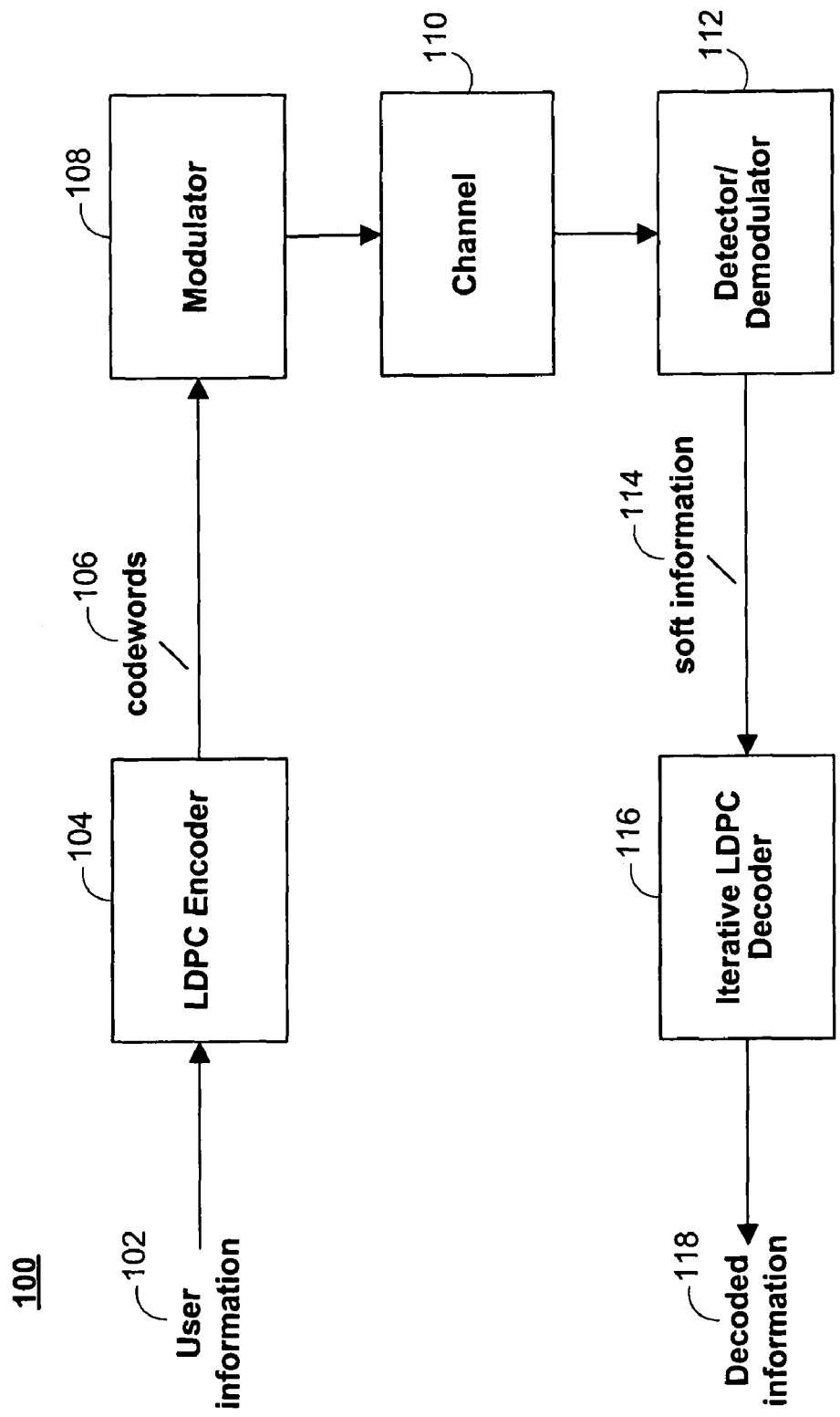
FIG. 1 is a block diagram of an exemplary communication/storage system that uses a low-density parity check (LDPC) code.

Referring to FIG. 1, there is shown an exemplary communication/storage system 100 that employs a low density parity check (LDPC) code. A LDPC code is a particular type of parity check code in which, generally, there are several parity check constraints and the number of variables in each parity check constraint is relatively small compared to the total number of bits n in a codeword. The disclosed technology can be especially advantageous when applied to LDPC codes. For ease of explanation, the disclosed technology will be described with respect to LDPC codes from this point on. However, it is contemplated that the disclosed technology can apply to parity check codes in general. User information 102 that is intended for communication/storage can be encoded by a LDPC encoder 104 to generate coded information/codewords 106. A modulator 108 can configure the codewords 106 into a signal (not shown), which is passed to the channel 110. The modulator 108 can employ a number of modulation techniques known in the art, such as binary phase shift keying (BPSK), for example.

As used herein, the term "channel" refers to the media, devices, and/or processing stages that occur between a modulator 108 and a detector/demodulator 112 and can correspond to a particular path of media/devices through which a signal can flow, a particular wavelength or time slot which a signal can utilize, and/or another multiple access scheme. For example, in FIG. 1, the channel 110 can correspond to storage and write and read components of a disk drive, including a magnetic storage medium, a disk-drive read/write head, and other storage system components. In some cases, the term "channel" as used herein can also include the modulator 108 and the demodulator/detector 112. While in the channel 110, the signal may encounter error-producing phenomena, such as device physical failure, device electrical failure, signal interference, and/or data loss due to buffer overflow, for example. The interference signals and other error-producing phenomena in a channel 110 will be referred to herein as "noise." As shown by the description above, the terms channel and noise are more conceptual than physical, but they correspond to physical aspects of a system. The channel 110 can exhibit characteristics that can be described by models. Some models known in the art include the additive white Gaussian noise (AGWN) channel, for example.

With continuing reference to FIG. 1, a signal on the channel 110 can be received by a detector/demodulator 112. The demodulator/detector 112 can produce soft information 114 for the coded information represented by the received signal (not shown). As used herein, the term "soft information" refers to information that indicates the likelihood of a symbol value. This soft information 114 commonly includes probability values and log-likelihood ratios. A LDPC decoder 116 receives the soft information 114 and uses the soft information 114 to attempt to recover the original user information 102. The illustrated LDPC decoder 116 is a particular type of decoder that uses an iterative decoding technique, which will be described in more detail later herein. The LDPC decoder 118 produces decoded information 118, which may or may not include errors. If there are no errors in the decoded information 118, the decoded information 118 will be the same as the user information 102. Otherwise, the decoded information 118 will be different from the user information 102.

Figures 2, 3:
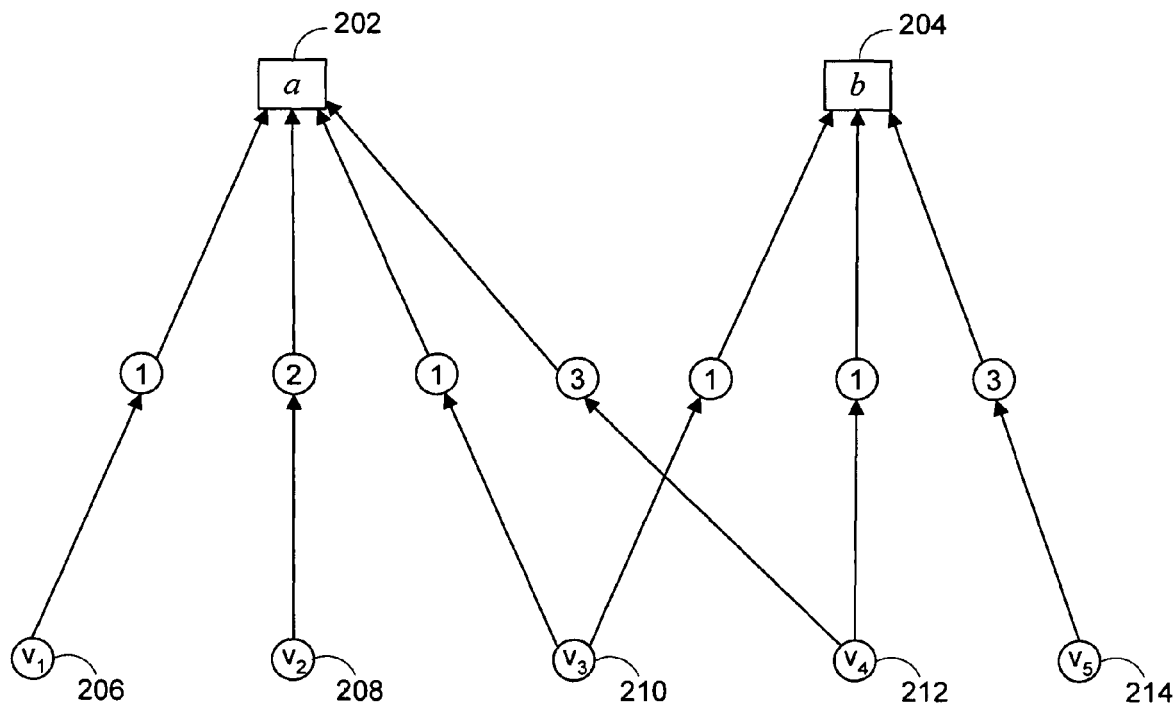
FIG. 2 is a diagram that graphically illustrates an exemplary LDPC code in GF(4)
FIG. 3 shows a matrix representation of the LDPC code of FIG. 2.

The LDPC encoder 104 and the LDPC decoder 116 of FIG. 1 correspond to a LDPC code. One example of a LDPC code is shown graphically in FIG. 2. The illustrated code includes two parity check constraints 202, 204 and five variables 206-214. As described above herein, a parity check constraint is a constraint on the result of a linear sum. In the illustrated code, parity check constraint "a" 202 is based on a linear sum of variables $v_1$, $v_2$, $v_3$, and $v_4$. The LDPC code of FIG. 2 is defined over a Galois field with field size q=4, i.e., GF(4). Therefore, the values involved in the illustrated LDPC code can only have one of four values: zero, one, two, or three. Each variable 206-214 corresponds to two bits because each variable can have one of four possible values. Therefore, the five variables 206-214 represent ten bits, grouped into five symbols (n=5). The illustrated parity check code is described in GF(4) for convenience. Field sizes other than q=4 can also be used. From this point on, each variable 206-214 will also be referred to as a "symbol," which is a grouping of two or more bits in a dataword or codeword.

Since the illustrated code is defined over GF(4), a linear sum can include coefficients that are GF(4) values. As an example, the parity check constraint "a" 202 can be $v_1+2v_2+v_3+3v_4=0$. These coefficients are shown in FIG. 2 in the circles between the parity check node "a" 202 and the variable nodes $v_1$ to $v_4$. Similarly, in the graph of FIG. 2, the illustrated parity check constraint "b" 204 can be $v_3+v_4+3v_5=0$. The zero summation constraint is exemplary, and in other embodiments, the linear sums may not equal zero and may equal another value.

The parity check code illustrated in FIG. 2 is exemplary. It is contemplated that aspects of the invention can apply to different parity check codes, which can be defined over various field sizes.

FIG. 3 shows a matrix representation of the parity check code of FIG. 2. The left-most matrix contains the coefficients of the linear sums, so that the first row corresponds to parity check constraint "a" 202 and the second row corresponds to parity check constraint "b" 204. This matrix is commonly referred to as the "parity check matrix," which is denoted as H. The elements of parity check matrix H are denoted by $h_{i,j}$, where i denotes the row number and j denotes the column number. The right-most matrix includes the constraints on the result of the linear sums, which are zeros in the illustrated example. The values of $v_1$ to $v_5$ that satisfy the parity check code are the parity check code's codewords, which are shown in the table of FIG. 4A. As shown in FIG. 4A, the parity check code of FIG. 2 includes sixty-four codewords, even though there are $4^5=1024$ combinations of GF(4) values for variables $v_1$ to $v_5$. Each of the codewords shown in FIG. 4A satisfies the matrix computation shown of FIG. 3.

A brief description of operations on a Galois field of size q, i.e., GF(q), will now be provided. It is known from abstract algebra that the field size q must be a power of a prime, i.e., $q=p^m$ for some prime p and positive integer m. The simplest cases occur when m=1. For such cases, the Galois field operations are equivalent to the usual integer operations modulo p. For example, let q=p=5. Then 3+4=7 mod 5=2, and 2×4=8 mod 5=3. When m>2, the operations are more complicated. In such cases, the element in GF($p^m$) should be viewed as a polynomial of degree at most (m−1) with coefficients in GF(p). For example, GF(4), i.e., p=2, m=2, contains the following polynomials: 0, 1, α, 1+α. GF(9), i.e., p=3, m=2, contains the following polynomials: 0, 1, 2, α, 1+α, 2+α, 2α, 1+2α, 2+2α.

The addition operation is performed by adding the coefficients. (Treat the coefficients as elements in GF(p).) If $1+α^2$ and $1+α+α^2$ are in GF($2^3$), then $(1+α^2)+(1+α+α2)=(1+1)+(0+1)α+(1+1)α^2=α$. The multiplication operation is performed by multiplying the polynomials modulo "primitive polynomial." A primitive polynomial for GF(8) is $1+α+α3$. For example:

$$(1+\alpha^2) \times (1+\alpha+\alpha^2) =$$
$$(1)(1+\alpha+\alpha^2) + (\alpha^2)(1+\alpha+\alpha^2) \bmod (1+\alpha+\alpha 3) =$$
$$(1+\alpha+\alpha 2) + (\alpha 2+\alpha 3+\alpha 4) \bmod 1+\alpha+\alpha 3 =$$
$$1+\alpha+\alpha 3+\alpha 4 \bmod 1+\alpha+\alpha 3 = \alpha+\alpha 2.$$

Note that the modulo operation is performed by dividing $1+\alpha+\alpha 3+\alpha 4$ by $1+\alpha+\alpha 3$ and keeping the remainder. In other words, $1+\alpha+\alpha 3+\alpha 4$ (dividend) can be written as $1+\alpha+\alpha 3$ (divisor) times $1+\alpha$ (quotient) pluses $\alpha+\alpha 2$ (remainder).

We can use numbers $0,1,\ldots,q-1$ to represent elements in $GF(q)$. Typically, 0 represents $0, \ldots, p-1$ represents $p-1$, $p$ represents $\alpha$, and so on. Below are the addition and multiplication tables for $GF(4)$.

| + | 0 | 1 | 2 | 3 | x | 0 | 1 | 2 | 3 |
|---|---|---|---|---|---|---|---|---|---|
| 0 | 0 | 1 | 2 | 3 | 0 | 0 | 0 | 0 | 0 |
| 1 | 1 | 0 | 3 | 2 | 1 | 0 | 1 | 2 | 3 |
| 2 | 2 | 3 | 0 | 1 | 2 | 0 | 2 | 3 | 1 |
| 3 | 3 | 2 | 1 | 0 | 3 | 0 | 3 | 1 | 2 |

It is noteworthy that in the special case of $GF(2^m)$, i.e., $p=2$, negative signs and positive signs are equivalent so that changing all negative signs to positive signs will still compute the correct result. However, in general, negative signs and positive signs are not equivalent and cannot be interchanged.

Referring again to FIG. 1, the LDPC encoder 104 operates based on the codewords of FIG. 4A. The encoder 104 includes a mapping of input datawords 102 to output codewords 106. If each input dataword 102 has one GF(4) symbol, then the encoder 104 will use only four codewords from FIG. 4A and will map each dataword 102 to one of the four codewords. If each input dataword 102 has two GF(4) symbols, then the encoder 104 will use sixteen codewords from FIG. 4A and will map each dataword 102 to one of the sixteen codewords. If each input dataword 102 has three GF(4) symbols, then the encoder 104 will use all sixty-four codewords from FIG. 4A and will map each dataword 102 to one of the sixty-four codewords. The input dataword 102 cannot have more than three GF(4) symbols because the parity check code of FIG. 2 has only sixty-four codewords. Therefore, depending on the number of symbols in the dataword 102, the LDPC encoder 104 may use all of the available codewords or a subset of the available codewords. The mapping can be designed in different ways that are known in the art. Additionally, the LDPC encoder 104 can generate codewords based on the mapping in different ways that are known in the art.

As described above herein, a modulator 108 receives the codewords 106 and modulates the codewords onto a signal (not shown) for communication and/or storage. The modulator 108 can operate based on many modulation technologies that are known in the art. For example, the modulator 108 can use constellation-based technologies such as quadrature amplitude modulation, phase shift keying, and/or amplitude shift keying. In different embodiments, the modulator 108 can map an entire codeword onto a single constellation point or map a codeword onto multiple constellation points. In some embodiments, the modulator 108 can map multiple codewords or portions of multiple codewords onto a single constellation point. Each constellation point can be represented by a signal's amplitude and/or phase, for example, so that an output signal (not shown) produced by the modulator 108 can include the codewords 106.

As described above herein, various phenomena can affect the signal (not shown) and thereby introduce errors into the codewords represented by the signal. For example, the channel 110 can filter the signal and noise can also affect the signal. Although some technologies exist to address some of these phenomena, errors may nevertheless remain in the signal when it is received by a detector/demodulator 112. The detector/demodulator 112 does not actually know which codewords were originally represented by the signal. Therefore, the detector/demodulator 112 produces soft information 114 that provides an indication of which codeword the received signal is most likely representing.

Figure 5:
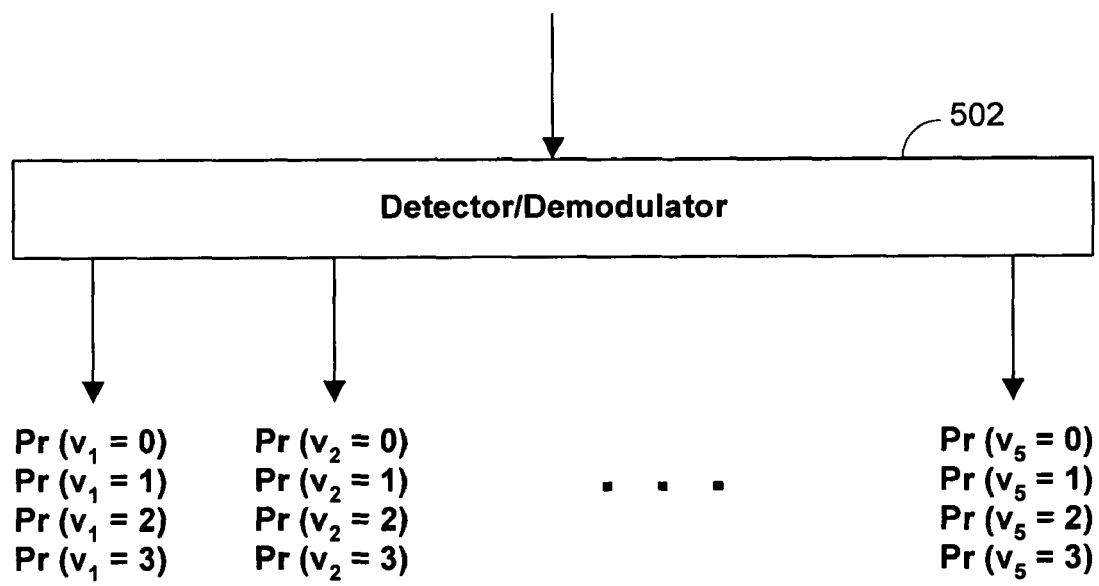
FIG. 5 is a block diagram of an exemplary detector/demodulator that produces soft information.

Referring now to FIG. 5, there is shown a block diagram of an exemplary detector/demodulator 502. The detector/demodulator 502 can produce soft information 114 for each symbol of received coded information. For example, using the parity check code of FIG. 2, each codeword includes five GF(4) symbols 206-214. For a symbol $v_1$, the detector 502 can compute the probabilities that $v_1=0$, $v_1=1$, $v_1=2$, and $v_1=3$, given the value of the received signal. For a symbol $v_2$, the detector 502 can compute the probabilities that $v_2=0$, $v_2=1$, $v_2=2$, and $v_2=3$, given the value of the received signal. The detector 502 can also compute these probabilities for symbols $v_3$, $v_4$, and $v_5$. Therefore, the detector 502 produces probabilities that are conditioned on the value of the received signal. However, FIG. 5 does not show the probabilities as conditional probabilities in order to improve readability. The probabilities can be computed based on a particular model for the channel. For example, if the channel is AWGN channel, the probabilities can be computed based on a particular Gaussian probability density function. Depending on the modulation technology, the symbols $v_1$ to $v_5$ may be modulated onto different constellation points, which may arrive at the detector/demodulator 502 at different times. Therefore, although FIG. 5 shows all of the soft information for symbols $v_1$ to $v_5$ together, the detector 502 may actually need to compute the illustrated soft information at different times.

Some examples of parity check code decoding will now be described. Using the probabilities shown in FIG. 5, there are at least two ways to perform decoding. In the first method, each symbol value is determined based on that individual symbol's probabilities. For example, referring to FIG. 5, the value of $v_1$ is determined based on the largest probability among $Pr(v_1=0)$, $Pr(v_1=1)$, $Pr(v_3=2)$, and $Pr(v_1=3)$. If $Pr(v_1=0)$ is the largest probability, then the value of $v_1$ is determined to be zero. Therefore, each symbol is determined without regard to whether the combination of the symbols forms a valid codeword. For this very reason, this decoding method can be undesirable because the resulting combination of symbol values may not be a codeword of the parity check code. In a second decoding method, the decoder computes codeword probabilities for each "valid" codeword, i.e., the probability of each of the codewords shown in FIG. 4A. For example, the probability that the received signal represented the codeword $(0,0,0,0,0)$ is $Pr(v_1=0)*Pr(v_2=0)*Pr(v_3=0)*Pr(v_4=0)*Pr(v_5=0)$. Thus, the probability that the received signal represented a particular valid codeword is the product of the valid codeword's corresponding symbol probabilities. The most-likely codeword represented by the received signal, then, is the valid codeword corresponding to the largest codeword probability.

A problem with the second decoding method described above is that it is very complex. A way to get close to the second decoding method above with reasonable complexity is called iterative decoding/message passing. This decoding method refines symbol probabilities iteratively by using "local information," which will be described later herein. In iterative decoding/message passing, the first iteration is the same as the first method described above. After the individual symbol determinations are made, if the combination does not form a valid codeword (e.g., one of the codewords in FIG. 4A), then the iterative LDPC decoder performs an iteration of the message passing technique (described below), and the individual symbol determinations are made again. In one embodiment, the iterative decoder can be configured to stop processing a codeword when a valid codeword is produced or when the decoder has performed a particular number of iterations. In one embodiment, if a valid codeword does not result after the particular number of iterations, the iterative decoder can signal a decoding failure.

The message passing technique is based on the concept that a symbol in a parity check constraint can gain information from the other symbols in the parity check constraint. For example, referring to the exemplary code of FIG. 2, parity check constraint "a" 202 is $v_1+2v_2+v_3+3v_4=0$. This parity check constraint can be transformed to be $v_1=(2v_2+v_3+3v_4)$, which is still performed in GF(4).

Based on this equation, the probability that $v_1=0$ is the probability that $2v_2+v_3+3v_4=0$, and the probability that $v_1=1$ is the probability that $2v_2+v_3+3v_4=-1=1$ (in GF(4)), and so on. The concept is that the soft information for $v_1$ can be computed based on the soft information for $v_2$, $v_3$, and $v_4$. As another example, variable node $v_3$ in FIG. 2 is part of two parity check constraints 202, 204. Therefore, the soft information for variable node $v_3$ can be computed based on soft information for the other variable nodes in parity check constraint "a" 202, as well as soft information for the other variable nodes in parity check constraint "b" 204.

For clarity of explanation, the soft information produced by the detector/demodulator (e.g., as shown in FIG. 5) will be referred to herein as "channel soft information." Also, in relation to a particular variable node in a parity check constraint, the other variable nodes in the parity check constraint will be referred to as "co-constraint nodes."

The term "message passing" describes the use of soft information from co-constraint nodes in relation to a "Tanner graph," e.g., FIG. 2. Each variable node 206-214 "sends" its soft information to the parity check node(s) 202, 204 in which it is used. The "message" sent from a variable node to a parity check node includes the variable node's soft information, e.g., its probabilities. After receiving messages from its variable nodes, a parity check node 202, 204 can re-distribute this soft information back to the variable nodes 206-214 in the manner described above, i.e., by computing a variable node's soft information based on the soft information for the co-constraint nodes. This re-distributed soft information is the message sent from a parity check node to a variable node. As later paragraphs will show, and in accordance with one aspect of the invention, the soft information that a parity check node sends to a variable node need not be all of the soft information from the co-constraint nodes.

Figure 6:
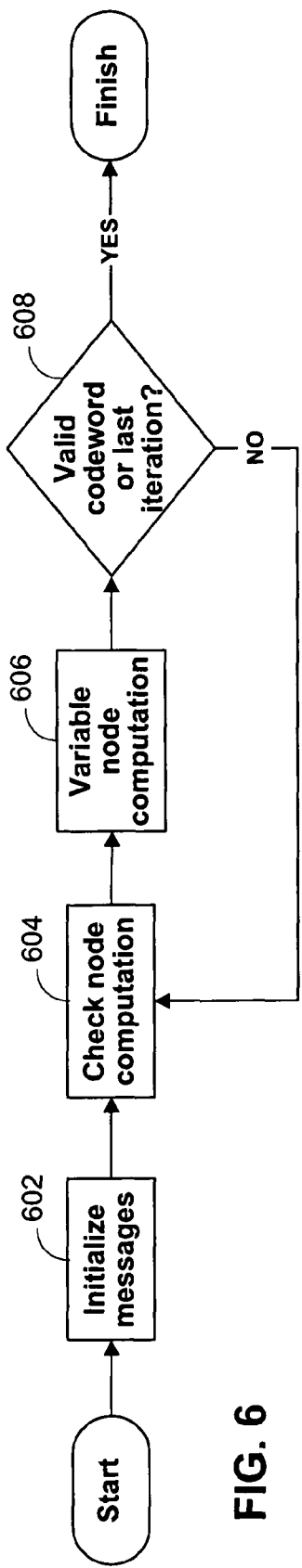
FIG. 6 is a flow diagram of an exemplary computations in iteratively decoding a LDPC code.

This message passing/iterative decoding technique is summarized in the flow chart of FIG. 6. Initially, the soft information at the variable nodes (i.e., the messages) are initialized to be the channel soft information 602. These messages are sent from the variable nodes to their corresponding parity check nodes. The parity check nodes compute the soft information (i.e., the return message) to send back to the variable nodes 604. The return messages are then sent from the parity check nodes back to the variable nodes. The variable nodes compute updated probabilities based on these messages and the channel soft information 606. The LDPC decoder then determines the most-likely values for the variable nodes 608 based on the updated probabilities. If the most-likely values for the variable nodes combine to form a valid codeword, or if a particular number of iterations is reached, the decoding ends. However, if the most-likely values for the variable nodes do not form a valid codeword, another message passing iteration can be performed 604, 606.

The mathematical notations for the messages will now be described. For ease of explanation, the disclosed technology will be described with respect to parity constraint "a" in FIG. 2. However, it will be understood that the following description applies to parity constraints in general. Referring again to FIG. 6 and as mentioned above herein, the initial variable node to check node messages are the channel soft information for the variable nodes 602. For each variable node $v_i$ and GF(q), the channel soft information includes the probabilities $P_{ch \to v_i}=[Pr(v_i=0) \ Pr(v_i=1) \ldots Pr(v_i=q-1)]$. Therefore, in the first message passing iteration (and only in the first iteration), the variable node to check node messages $P_{v_i \to c}$ are equal to $P_{ch \to v_i}$. This set of probabilities $P_{v_i \to c}$ is called a "probability distribution function" for the variable $v_i$. Therefore, the initial message $P_{v_i \to c}$ from a variable node $v_i$ to its corresponding parity check node c is the variable node's probability distribution function ("PDF"). After a parity check node c receives these messages, it computes return messages $P_{c \to v_i}=[Pr(v_i=0) \ Pr(v_i=1) \ldots Pr(v_i=q-1)]$ to send back to the variable nodes $v_i$ 604. The return message is also a PDF, but the probabilities in the return message are computed based on soft information for co-constraint nodes.

Suppose a parity check node c has k variable nodes $v_1, \ldots, v_k$. (Note that k here is a general variable and does not refer to the number of symbols in a dataword, as described above herein.) For example, referring to FIG. 4B, there is shown only the variables that are part of parity constraint "a" from FIG. 2. For convenience, the combinations shown in FIG. 4B will be referred to herein as "parity check 'a' codewords." This terminology can be applied to any parity check, such as parity check "b" from FIG. 2. Thus, the combinations of parity check "b" variables can be referred to as "parity check 'b' codewords." Now, referring again to FIG. 4B, let $V_{v_i=x}$ denote the set of all valid parity check "a" codewords in which $v_i=x$, and let $\alpha=(\alpha_1 \alpha_2 \ldots \alpha_k)$ denote the values of a parity check "a" codeword in $V_{v_i=x}$. By this definition, $\alpha_i=x$ for all parity check "a" codewords in $V_{v_i=x}$. Mathematically, the probabilities in the return message are computed by the equation:

$$Pr(v_i = x) = \sum_{\alpha \in V_{v_i=x}} \left( \prod_{j=1, j \neq i}^{k} Pr(v_j = \alpha_j) \right) \quad (1)$$

where the probabilities $Pr(v_j=\alpha_j)$ in the computation are taken from the variable node to check node messages.

As an example, referring to parity check constraint "a" 202 in FIG. 2, the constraint 202 has k=4 variable nodes, with each variable node being defined over GF(q), q=4. Therefore, parity check constraint "a" 202 needs send return message $P_{c \to v_1}=[Pr(v_1=0) \ Pr(v_1=1) \ Pr(v_1=2) \ Pr(v_1=3)]$ to variable node $v_1$, return message $P_{c \to v_2}=[Pr(v_2=0) \ Pr(v_2=1) \ Pr(v_2=2) \ Pr(v_2=3)]$ to variable node $v_2$, return message $P_{c \to v_3}=[Pr(v_3=0) \ Pr(v_3=1) \ Pr(v_3=2) \ Pr(v_3=3)]$ to variable node $v_3$, and return message $P_{c \to v_4}=[Pr(v_4=0) \ Pr(v_4=1) \ Pr(v_4=2)$ Pr($v_4$=3)] to variable node $v_4$. The parity check "a" codewords that satisfy the parity check constraint "a" 202 are shown in FIG. 4B.

In return message $P_{c \to v_1}$, we compute $$Pr(v_1 = 0) = \sum_{\alpha \in V_{v_1=0}} \left( \prod_{j=1, j \neq 1}^{4} Pr(v_j = \alpha_j) \right)$$

according to equation (1). It can be seen that $V_{v_1=0}$ is simply the set of sixteen parity check "a" codewords in FIG. 4B where $v_1$=0. The equation computes, for each of the sixteen codewords $\alpha$=(0 $\alpha_2$ $\alpha_3$ $\alpha_4$) in $V_{v_1=0}$, the product $$\prod_{j=1, j \neq 1}^{4} Pr(v_j = \alpha_j),$$

which equals Pr($v_2$=$\alpha_2$)Pr($v_3$=$\alpha_3$)Pr($v_4$=$\alpha_4$). The probabilities Pr($v_j$=$\alpha_j$) in the products are taken from the variable node to check node messages. The sum of all of these sixteen products is the probability that $v_1$=0, computed based on the soft information for $v_2$, $v_3$, and $v_4$. The probabilities Pr($v_1$=1), Pr($v_1$=2), and Pr($v_1$=3) in the return message $P_{c \to v_1}$ can be computed in the same way. Additionally, the return messages $P_{c \to v_2}$, $P_{c \to v_3}$, and $P_{c \to v_4}$ are also computed in the same way.

It can be seen that the return message computations at the parity check nodes are rather intensive. One way to compute equation (1) is by using a technique called "forward-backward computation," which will be known to one skilled in the art. However, even with forward-backward computation, the return message computations remain quite complex. One approximation, called the max-product algorithm, greatly simplifies the computation in equation (1). The max-product algorithm approximates the summation by using only the largest term in the sum. With the approximation, the return message probability becomes:

$$Pr(v_i = x) = \max_{\alpha \in V_{v_i=x}} \left( \prod_{j=1, j \neq i}^{k} Pr(V_j = \alpha_j) \right). \quad (2)$$

The complexity of the computation in equation (2) can be further simplified by using log-ratios (LR) in place of probabilities, which transforms the multiplication operations in equation (2) into additions. A LR is another way of representing a probability. In particular, a LR is defined as $$L_{v_i}(x) = \log\left( \frac{Pr(v_i = x)}{Pr(v_i = 0)} \right) = \log(Pr(v_i = x)) - \log(Pr(v_i = 0)).$$

Given a probability distribution function [Pr($v_i$=0) Pr($v_i$=1) ... Pr($v_i$=q-1)], the log-ratios corresponding to the probabilities are [$L_{v_i}$(0) $L_{v_i}$(1) ... $L_{v_i}$(q-1)]. It can be seen that $L_{v_i}$(0) will always be zero. Therefore, there is no need to store $L_{v_i}$(0), and the set of LRs becomes [$L_{v_i}$(1) $L_{v_i}$(2) ... $L_{v_i}$(q-1)].

A second step in the simplification involves what will be referred to herein as "permutation." We begin by recognizing that a parity check constraint c is a linear sum of the form $$\sum_{i=1}^{k} h_i v_i = 0,$$

where $h_i$ is an element of a parity check matrix row corresponding to parity check constraint c. By defining $w_i$ as the product $h_i v_i$, the parity check constraint c becomes $$\sum_{i=1}^{k} w_i = 0.$$

We can "permute" the variable nodes $v_i$ in FIG. 4B into permuted variable nodes $w_i$. For example, for parity check constraint "a" 202 in FIG. 2, $w_1$=$v_1$, $w_2$=2$v_2$, $w_3$=$v_3$, and $w_4$=4$v_4$. It can be seen that Pr($w_i$=x)=Pr($h_i v_i$=x)=Pr($v_i$=$h_i^{-1}$x). Therefore, we can compute the PDF of the permuted variable nodes $w_i$ using the PDF of variable nodes $v_i$.

Using the permuted variable nodes $w_i$, suppose a parity check node c has k terms $w_1$, ..., $w_k$ such that $$\sum_{i=1}^{k} w_i = 0.$$

Let $B_{wi=x}$ denote the set of all valid permuted parity check "a" codewords ($w_1$ $w_2$ ... $w_k$) in which $w_i$=x, and let $\beta$=$\beta_1$ $\beta_2$ ... $\beta_k$) denote the values of the permuted parity check "a" codewords in $B_{w_i=x}$. Therefore, $$\beta_i + \sum_{j=1, j \neq i}^{k} \beta_j = 0.$$

By this definition, $\beta_i$=x and $$\sum_{j=1, j \neq i}^{k} \beta_j = -\beta_i = -x$$

for all permuted parity check "a" codewords in $B_{w_i=x}$. Mathematically, the probabilities in the return message are computed by the equation:

$$Pr(w_i = x) = \sum_{\beta \in B_{wj=x}} \left( \prod_{j=1, j \neq i}^{k} Pr(w_j = \beta_j) \right). \quad (3)$$

where the probabilities Pr($w_j$=$\beta_j$) in the computation are taken from the permuted variable node to check node messages. Applying the max-product approximation to equation (3), the result is:

$$Pr(w_i = x) = \max_{\beta \in B_{wj=x}} \left( \prod_{j=1, j \neq i}^{k} Pr(w_j = \beta_j) \right). \quad (4)$$

Combining the permutation concept with LRs, a LR based on a permuted variable is $$L_{w_i}(x) = \log\left(\frac{Pr(w_i = x)}{Pr(w_i = 0)}\right) = \log\left(\frac{Pr(v_i = h_i^{-1}x)}{Pr(v_i = 0)}\right) = L_{v_i}(h_i^{-1}x),$$

which can be computed from a non-permuted LR. Using the permuted LRs, it can be shown that $$L_{w_i}(x) \approx \max_{\beta \in B_{wj=x}} \left( \sum_{j=1, j \neq i}^{k} L_{w_j}(\beta_j) \right) - \max_{\beta \in B_{wj=0}} \left( \sum_{j=1, j \neq i}^{k} L_{w_j}(\beta_j) \right). \quad (5)$$

Accordingly, it can be seen that the multiplication operations in equations (2) and (4) have been converted into addition operations, as shown in equation (5), by using permuted LRs. However, even using the forward-backward computation, the number of additions/comparisons is approximately $6kq^2$, where k is the degree of the parity check constraint, and q is the field size. This computation can be resource intensive when the parity check code has high rate, i.e., when k is large. Moreover, the forward-backward computation requires large memory since it is an "edge-based" design, i.e., all edge messages must be stored.

One way to further reduce the computation complexity in equation (5) is called the "min-sum" algorithm. The improvement is based on the notion that operations involving negative values are more complicated to implement than operations involving only non-negative values. The operation in equation (5) may involve negative values because log-ratios can be negative. However, by using a metric that is based on log-ratio differences, the computation in equation (5) can be converted to involve only non-negative values. First, using variable nodes, we introduce a variable $$s_{v_i} = arg\left( \max_{x \in GF(q)} L_{v_i}(x) \right),$$

which returns the value of x in GF(q) which corresponds to the maximum log-ratio $L_{v_i}(x)$. Defined in this manner, $s_{v_i}$ is the most-likely value for variable node $v_i$. We then define a difference metric $M_{v_i}(x) = L_{v_i}(s_{v_i}) - L_{v_i}(s_{v_i} - x)$, which will be non-negative because $L_{v_i}(s_{v_i})$ is the maximum log-ratio. The value x in the metric $M_{v_i}(x)$ can be thought of as a "perturbation" from the most-likely value $s_{v_i}$. When there is no perturbation (i.e., x=0), $M_{v_i}(0)$ will always be zero. Therefore, there is no need to store the metric value for x=0. When the perturbation value x is not zero, the metric measures the difference between the log-ratio for the most-likely variable value and the log-ratio for another variable value. A smaller difference indicates that the other variable value is more likely (although still less likely than $s_{v_i}$), and a larger difference indicates that the other variable value is less likely. Thus, q−1 unsigned numbers together with $s_{v_i}$ are sufficient to describe the soft information for a variable node $v_i$.

Using permuted variables, the metric becomes $M_{w_i}(x) = L_{w_i}(s_{w_i}) - L_{w_i}(s_{w_i} - x)$. A log-ratio can be computed based on metric values by $L_{w_i}(x) = M_{w_i}(s_{w_i}) - M_{w_i}(s_{w_i} - x)$. It can be shown that the computation in equation (5) can be equivalently computed using the metric form:

$$s_{w_i} = -\sum_{j=1, j \neq i}^{k} s_{w_j}, \text{ and} \quad (6)$$

$$M_{w_i}(w) = \min_{\beta \in B} \sum_{j=1, j \neq i}^{k} M_{w_j}(\beta_j) \quad (7)$$

where B is the set of all perturbations $\beta = (\beta_1 \beta_2 \ldots \beta_k)$ such that $$\sum_{j=1, j \neq i}^{k} \beta_j = -x.$$

Equation (6) computes the most-likely value of permuted variable node $w_i$ based on the most-likely values of co-constraint nodes and based on recognizing the constraint $$\sum_{j=1}^{k} w_j = 0.$$

In equation (7), the idea behind set B is that the value of x in $M_{w_i}(x)$ is a perturbation from the most-likely value $s_{w_i}$ in $w_i$, and the difference $s_{w_i} - x$ can be computed based on differences from co-constraint permuted nodes. Specifically, based on equation (6), the difference $s_{w_i} - x$ can be equivalently described by $$-\sum_{j=1, j \neq i}^{k} s_{w_j} - x.$$

The idea behind the set B is that it contains the set of perturbations $\beta = (\beta_1 \beta_2 \ldots \beta_k)$ such that the sum of differences $$-\sum_{j=1, j \neq i}^{k} (s_{w_j} - \beta_j)$$

will be equal to $$-\sum_{j=1, j \neq i}^{k} s_{w_j} - x.$$

Therefore, the perturbation x in the permuted node $w_i$ can be based on some combination of perturbations $\beta_j$ in the co-constraint nodes.

Figure 7:
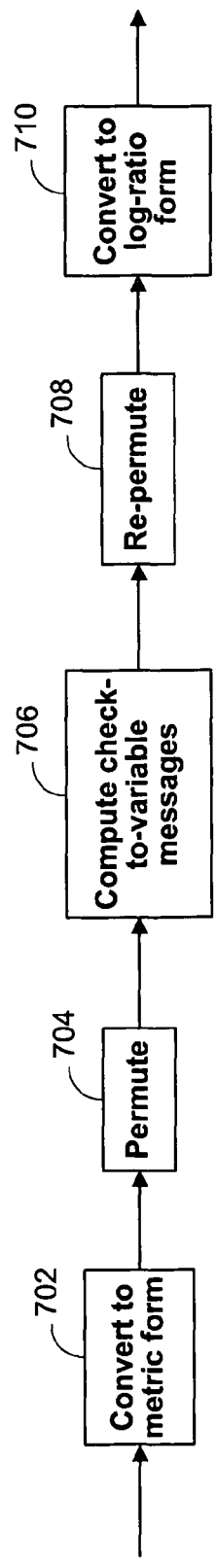
FIG. 7 is a flow diagram of exemplary computations for the check node computation of FIG. 6.

FIG. 7 shows an exemplary flow diagram that summarizes the computation of the return messages at a parity check node. The illustrated embodiment assumes that the soft information for the variable nodes are in log-ratio form $L_{v_i} = [L_{v_i}(1) \, L_{v_i}(2) \ldots L_{v_i}(q-1)]$. A parity check node can receive a log-ratio message $L_{v_j \to c} = [L_{v_j}(1) \, L_{v_j}(2) \ldots L_{v_j}(q-1)]$ from a variable node. The parity check node can convert the log-ratio message $L_{v_j \to c}$ into metric form $s_{v_j}$, $M_{v_j \to c} = [M_{v_j}(1) \, M_{v_j}(2) \ldots M_{v_j}(q-1)]$ 702 and permute the metric form $s_{v_j}$, $M_{v_j \to c}$ into permuted metric form $s_{w_j}$, $M_{w_j \to c} = [M_{w_j}(1) \, M_{w_j}(2) \ldots M_{w_j}(q-1)]$ 704. The return messages $s_{w_j}$, $M_{c \to w_j}$ can be computed in accordance with equations (6) and (7) 706. The return message $s_{w_j}$, $M_{c \to w_j} = [M_{w_j}(1) \, M_{w_j}(2) \ldots M_{w_j}(q-1)]$ can be re-permuted into metric form $s_{v_j}$, $M_{c \to v_j} = [M_{v_j}(1) \, M_{v_j}(2) \ldots M_{v_j}(q-1)]$ 708, and then converted back into log-ratio form $L_{c \to v_j} = [L_{v_j}(1) \, L_{v_j}(2) \ldots L_{v_j}(q-1)]$ 710.

Referring again to FIG. 6, when a variable node $v_i$ receives a return message $L_{c \to v_i} = [L_{v_i}(1) \, L_{v_i}(2) \ldots L_{v_i}(q-1)]$ from a check node c, the variable node $v_i$ can compute updated log-ratio values based on the return message. In general, if a variable node $v_i$ receives return messages from check nodes defined by a set $A_{v_i}$, the updated log-ratio values can be computed by $$L_{v_i} = L_{ch \to v_i} + \sum_{a \in A_v} L_{a \to v_i}.$$

However, when the variable node $v_i$ sends a message to a parity check node c in a next iteration, the message in the next iteration removes the return message that was received from parity check node c, i.e., $L_{v_i \to c} = L_{V_i} - L_{C \to V_i}$.

The check node computation up to equation (5), together with variable node computations described in the previous paragraph, is regarded in the art as "min-sum" decoding. The min in min-sum comes from equation (7), which is another way of writing equation (5). The sum comes from variable node computations, which are described in the previous paragraph.

Referring again to equation (7), and in accordance with one aspect of the invention, a LDPC decoder can estimate the return message computation of equation (7) using a low-complexity procedure. The concept behind this procedures is based on the observation that the minimum in equation (7) is often achieved when almost all $\beta_j$ are zero because $M_{w_j}(0) = 0$. Therefore, when computing the minimum in equation (7), the computation can be simplified (and approximated) by limiting to a particular number d the number of perturbations in $(\beta_1, \ldots, \beta_{i-1}, \beta_{i+1}, \ldots, \beta_k)$ that can be non-zero. Using d=2, for example, each summation $$\sum_{j=1, j \neq i}^{k} M_{w_j}(\beta_j)$$

in equation (7) will include at most two non-zero terms, thereby reducing the complexity of the computation in equation (7), while maintaining acceptable accuracy. The values of d can be greater than two, but the complexity of approximating the computation of equation (7) will also increase.

In general, the smallest value of d that is sufficient to guarantee the same result as d=k-1 is $\log_2(q)$, provided that the field size q is a power of 2. The proof of this property is shown in U.S. Provisional Patent Application No. 60/772,756, which is already incorporated by reference herein. However, this does not mean that if d is large enough, this procedure (described below) will provide the same result as the min-sum computation of equation (7). The goal here is to compute (or approximate) $M_{w_i}(x)$ in equation (7). As described above, if d is large enough, e.g., $d = \log_2(q)$ where q is a power of two, then there is a perturbation vector $(\beta_1, \ldots, \beta_{i-1}, \beta_{i+1}, \ldots, \beta_k)$ in set B with at most d non-zero entries that achieves the minimum in equation (7). As will be shown below, the procedure described below inherently assumes d=2 since it only collects minimum i'(x) and second minimum i"(x). Even if we collect third minimum and so on, we may not get the same result as min-sum in equation (7).

Figure 8:
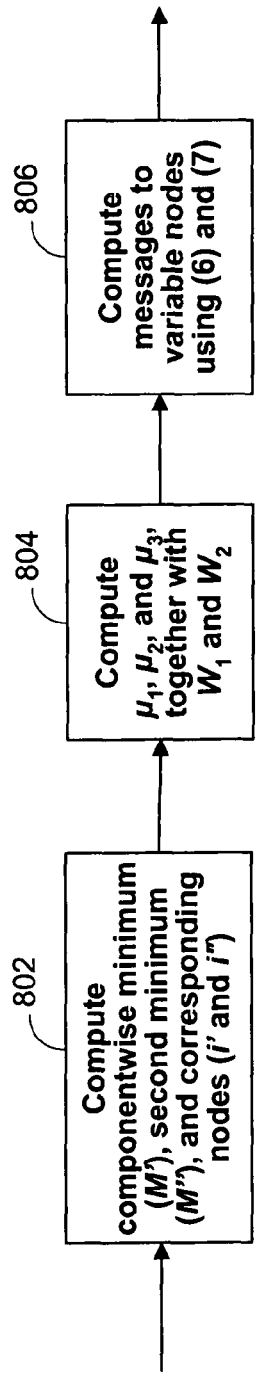
FIG. 8 is a diagram of an exemplary computations for the check-to-variable computation of FIG. 7.

In accordance with one aspect of the invention, and referring to FIG. 8, the low-complexity procedure first collects, for each nonzero perturbation $x \in GF(q)$, the "component-wise minimum" and then collects the "component-wise second minimum" of the permuted variable nodes' messages 802. The component-wise minimum is defined as $$M'(x) = \min_{i \in \{1, \ldots, k\}} M_{w_i}(-x),$$

which is collected first for each nonzero perturbation $x \in GF(q)$. The component-wise second minimum is defined as $$M''(x) = \min_{j \in \{1, \ldots, k\}} M_{w_j}(-x),$$

which is collected after the component-wise minimum, for which we enforce the rule that the value of j corresponding to M"(x) cannot be the same as the value of corresponding to M'(x). (Note that $M_{w_i}$ and $M_{w_j}$ used here to compute M'(x) and M"(x) refer to messages from the variable nodes to check nodes and do not refer to the $M_{w_i}(x)$ return message computation of equation (7).) The value of i corresponding to M'(x) is stored as i'(x), and the value of j corresponding to M"(x) is stored as i"(x). Written another way, these functions become $$i'(x) = \arg\left(\min_{i \in \{1, \ldots, k\}} M_{w_i}(-x)\right),$$
$$M'(x) = M_{w_{i'(x)}}(-x),$$
$$i''(x) = \arg\left(\min_{i \in \{1, \ldots, k\}, i \neq i'(x)} M_{w_i}(-x)\right),$$
$$M''(x) = M_{w_{i''(x)}}(-x).$$

We could also collect third minimum and higher, but the complexity will increase. From this point on, the following paragraphs will describe the disclosed technology using two component-wise minimums. However, it is contemplated that the disclosed technology can apply to more than two component-wise minimums as well.

Continuing with the above example, for each nonzero perturbation $x \in GF(q)$, we form a set $$S_x = \{M'(x), M''(x), M'(y) + M'(x-y), M'(y) + M''(x-y),$$
$$M''(y) + M'(x-y), M''(y) + M''(x-y)\}, \quad (8)$$

where y ranges over all non-zero symbols of GF(q) such that $y \neq x$, and each of the four last terms is included only if $i'(y) \neq i'(x-y)$, $i'(y) \neq i''(x-y)$, $i''(y) \neq i'(x-y)$, and $i''(y) \neq i''(x-y)$, respectively. The set $S_x$ includes all of the terms M'(y)+M'(x−y), M'(y)+M''(x−y), M''(y)+M'(x−y), M''(y)+M''(x−y) that satisfy the conditions above. Thus, the size of the set $S_x$ may be greater than six. If all of the conditions above are true, the size of the set $S_x$ will be 2+4(q−2). Optionally, the complexity of this procedure can be reduced even further by, for example, discarding the last term or the last three terms from the set $S_x$.

Next, in one embodiment, we determine the minimum $\mu_1(x)$, the second minimum $\mu_2(x)$, and the third minimum $\mu_3(x)$ from this set $S_x$ 804. We also collect the set of permuted variable nodes $W_1(x)$ and $W_2(x)$ associated with the first and second minimums, respectively. For example, if $\mu_i(x)=M'(x)$, then $W_i(x)=\{i'(x)\}$; if $\mu_i(x)=M'(y)+M''(x-y)$, then $W_i(x)=\{i'(y), i''(x-y)\}$, etc. Finally, the output message 806 to node $w_i$ is $$s_{w_i} = -\sum_{j=1, j \neq i}^{k} s_{w_j}, \quad (9)$$

$$M_{w_i}(x) = \begin{cases} \mu_1(x) & \text{if } w_i \notin W_1(x), \\ \mu_2(x) & \text{if } w_i \notin W_1(x) \text{ and } w_i \notin W_2(x), \\ \mu_3(x) & \text{otherwise.} \end{cases} \quad (10)$$

In general, the number of minima we select from a set $S_x$ can be varied and need not be three. In the description above, the number of minima is three ($\mu_1, \mu_2, \mu_3$). In another embodiment, if the number of minima is two, then equation (10) becomes $$M_{w_i}(x) = \begin{cases} \mu_1(x) & \text{if } w_i \notin W_1(x), \\ \mu_2(x) & \text{otherwise.} \end{cases} \quad (11)$$

If the number of minima is four, then equation (10) becomes $$M_{w_i}(x) = \begin{cases} \mu_1(x) & \text{if } w_i \notin W_1(x), \\ \mu_2(x) & \text{if } w_i \in W_1(x) \text{ and } w_i \notin W_2(x), \\ \mu_3(x) & \text{if } w_i \in W_1(x), w_i \in W_2(x), \text{ and } w_i \notin W_3(x) \\ \mu_4(x) & \text{otherwise.} \end{cases} \quad (12)$$

As a numerical example of the above, exemplary messages and return messages corresponding to the LDPC code of FIG. 2 are shown in FIGS. 9-12. The examples are based on selecting three minima from the set $S_x$. Consider a code over GF(4) with the following parity-check matrix.

$$H = \begin{bmatrix} 1 & 2 & 1 & 3 & 0 \\ 0 & 0 & 1 & 1 & 3 \end{bmatrix}.$$

Figure 9:
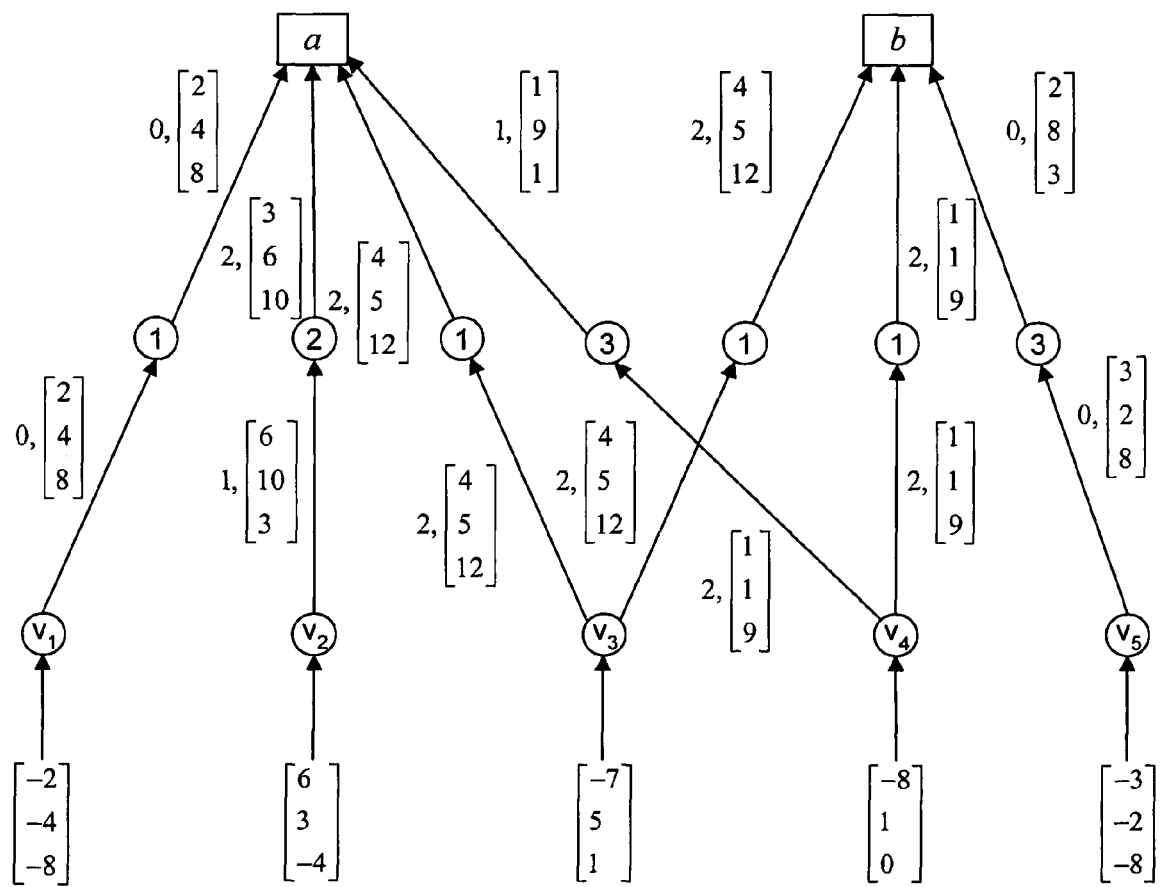
FIG. 9 is a diagram of exemplary variable-to-check node messages.

The decoding algorithm starts by converting the channel information to the metric form. Then these messages are permuted based on the entries in the parity-check matrix and sent to the check nodes (FIG. 9). Note that we use the notation $$s_v, \begin{bmatrix} M_v(1) \\ M_v(2) \\ M_v(3) \end{bmatrix}$$

to represent a message in the metric form.

At check node "a", the component-wise minimum (M'), second minimum (M''), and the corresponding edges are $$M' = \begin{bmatrix} 1 \\ 4 \\ 1 \end{bmatrix}, \; i' = \begin{bmatrix} 4 \\ 1 \\ 4 \end{bmatrix}, \; M'' = \begin{bmatrix} 2 \\ 5 \\ 8 \end{bmatrix}, \; i'' = \begin{bmatrix} 1 \\ 3 \\ 1 \end{bmatrix}.$$

Then the sets $S_x$ as in equation (8) are formed and we compute $$\mu_1 = \begin{bmatrix} 1 \\ 3 \\ 1 \end{bmatrix}, \; W_1 = \begin{bmatrix} \{4\} \\ \{1,4\} \\ \{4\} \end{bmatrix}, \; \mu_2 = \begin{bmatrix} 2 \\ 4 \\ 5 \end{bmatrix}, \; W_2 = \begin{bmatrix} \{1\} \\ \{1\} \\ \{1,4\} \end{bmatrix}, \; \mu_3 = \begin{bmatrix} 5 \\ 5 \\ 6 \end{bmatrix}.$$

The check-to-variable messages will be computed from this information using (9) and (10):

$$1, \begin{bmatrix} 1 \\ 5 \\ 1 \end{bmatrix}, \; 3, \begin{bmatrix} 1 \\ 3 \\ 1 \end{bmatrix}, \; 3, \begin{bmatrix} 1 \\ 3 \\ 1 \end{bmatrix}, \; 0, \begin{bmatrix} 2 \\ 4 \\ 6 \end{bmatrix}.$$

Note that, if the min-sum in equation (7) is used, the messages would be slightly different; they would be:

$$1, \begin{bmatrix} 1 \\ 4 \\ 1 \end{bmatrix}, \; 3, \begin{bmatrix} 1 \\ 3 \\ 1 \end{bmatrix}, \; 3, \begin{bmatrix} 1 \\ 3 \\ 1 \end{bmatrix}, \; 0, \begin{bmatrix} 2 \\ 4 \\ 7 \end{bmatrix}.$$

Figure 10:
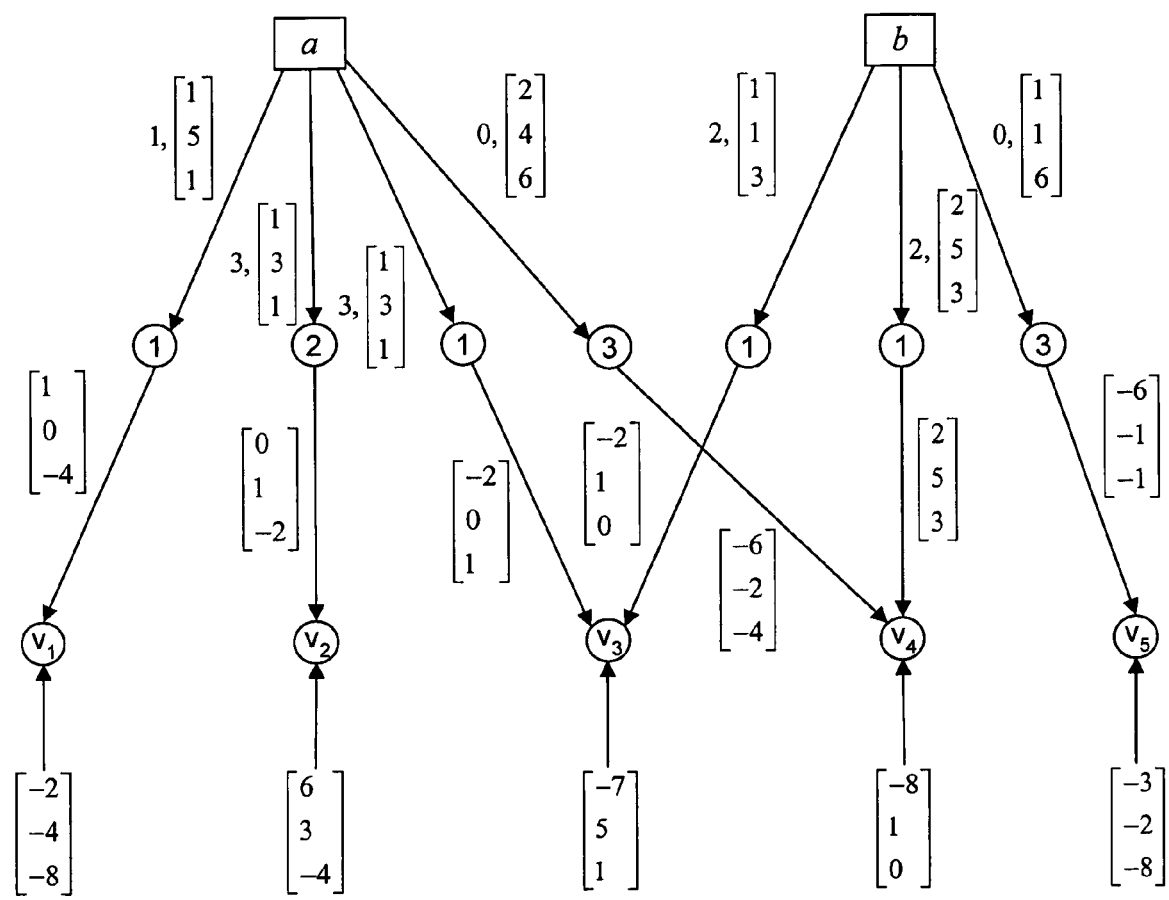
FIG. 10 is a diagram of exemplary check-to-variable node messages that are based on the values of FIG. 9.
Figure 11:
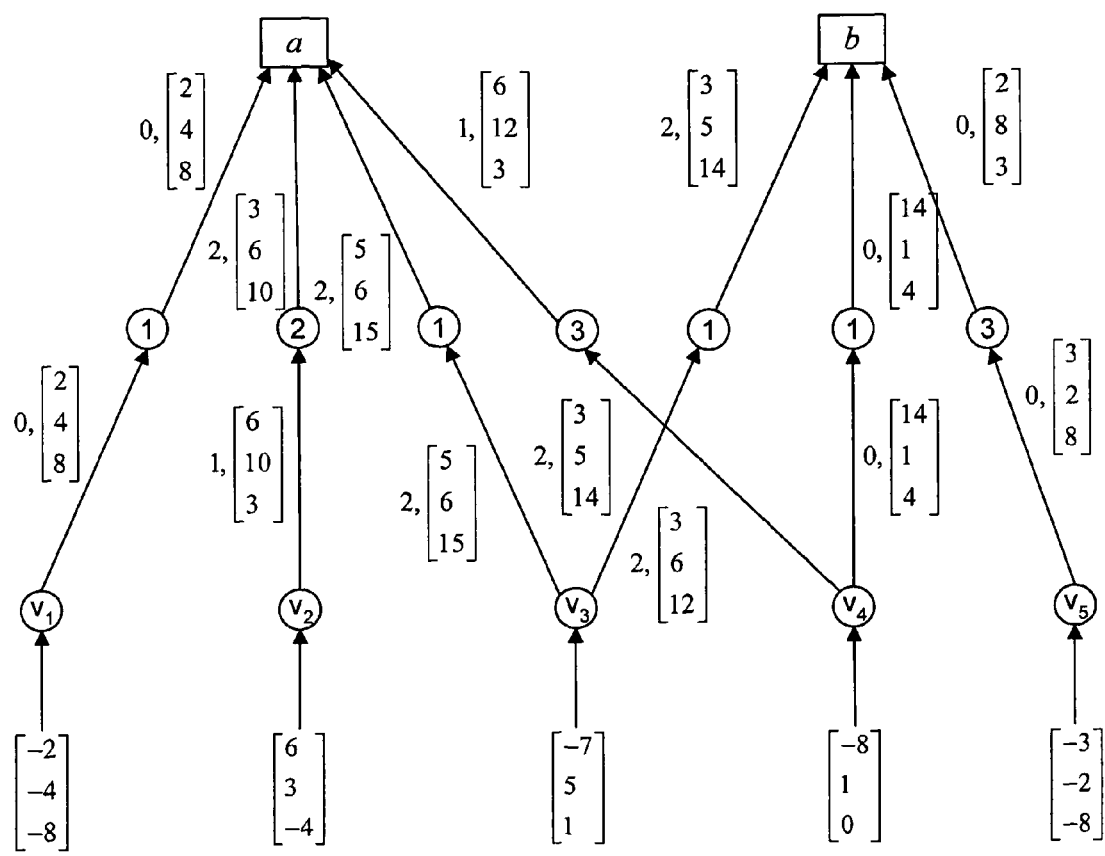
FIG. 11 is a diagram of exemplary variable-to-check node messages that are based on the values of FIG. 10.
Figure 12:
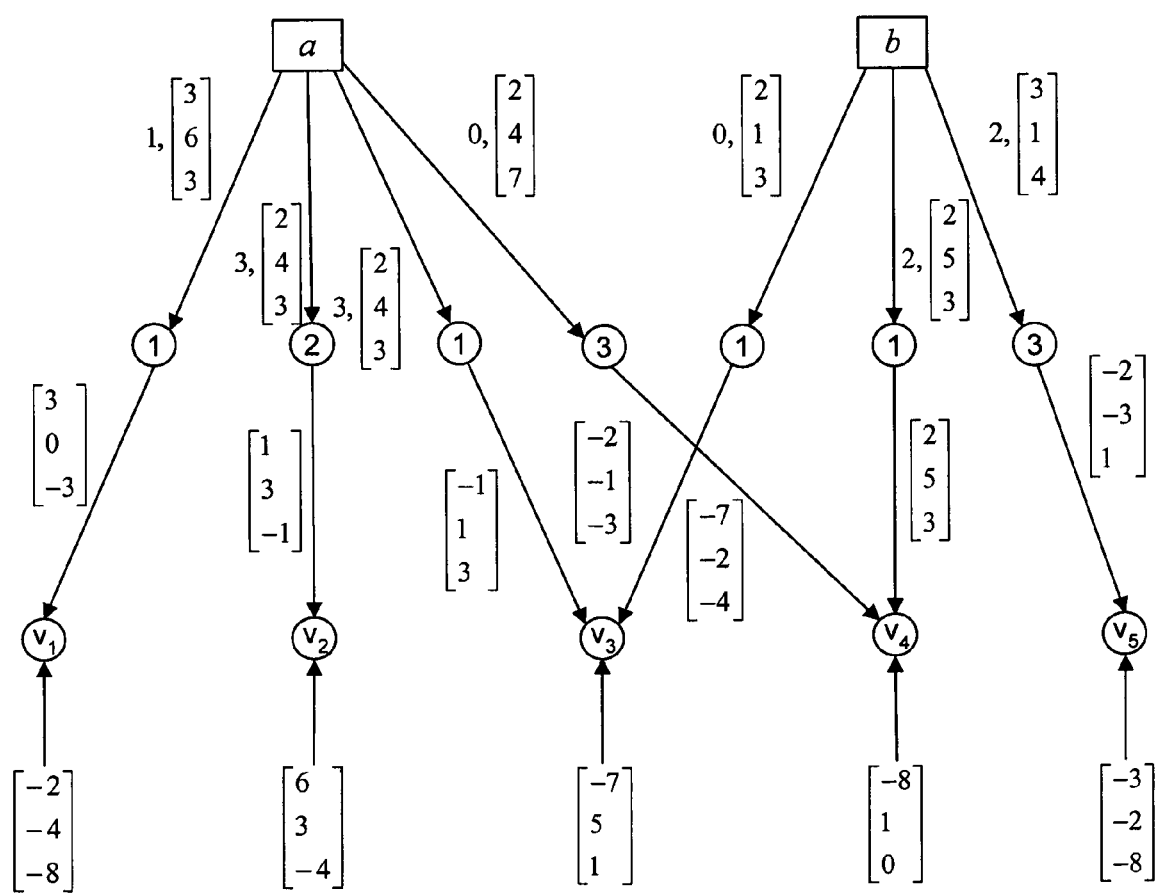
FIG. 12 is a diagram of exemplary check-to-variable node messages that are based on the values of FIG. 11.

The first iteration is completed by de-permuting and converting the messages to the log-ratio form (FIG. 10). The second iteration is shown in FIGS. 11 and 12. The final hard decision is [1 1 2 2 0].

In some embodiments, normalization techniques may be applied to the decoding algorithms described herein. The idea behind this normalization is that the approximation computed using equation (4) is smaller than the exact computation of equation (3). For the same reason, the messages computed using equation (7) are larger than an exact computation. In order to better approximate the exact computation, the messages computed using equation (7) may be multiplied by a constant less than 1 to reduce the value of the computed messages. For example, multiplication by this constant may occur at the output of block 706 of FIG. 7. An exemplary normalization technique is described in greater detail in J. Chen, A. Dholakia, E. Eleftheriou, M. P. C. Fossorier, and X. Hu, "Reduced-complexity decoding of LDPC codes," IEEE Trans. Commun., vol. 53, no. 8, pp. 1288-1299, August 2005, which is hereby incorporated herein by reference in its entirety.

Accordingly, what have been described thus far are systems and methods for performing a less resource intensive way of decoding parity check codes. When applied to the min-sum algorithm, the disclosed technology approximates the min-sum decoding algorithm. In particular, for a parity check node that receives messages from its variable nodes, the disclosed technology identifies component-wise minima among the messages, forms combinations of the component-wise minima, and identifies the combinations having the lowest values. These lowest-value combinations are then used to compute the return messages from the parity check node back to the variable nodes. In various embodiments, each combination of component-wise minima are made from at most a number d of components, where the number d can vary depending on the application. In various embodiments, the number of lowest-value combinations that are selected can vary depending on the application. The various aspects of the technology described herein can be implemented using hardware circuitry, including analog and/or digital circuitry, and/or using software instructions running on a processor architecture.

Referring now to FIGS. 13A-13G, various exemplary implementations of the present invention are shown.

Figure 13A:
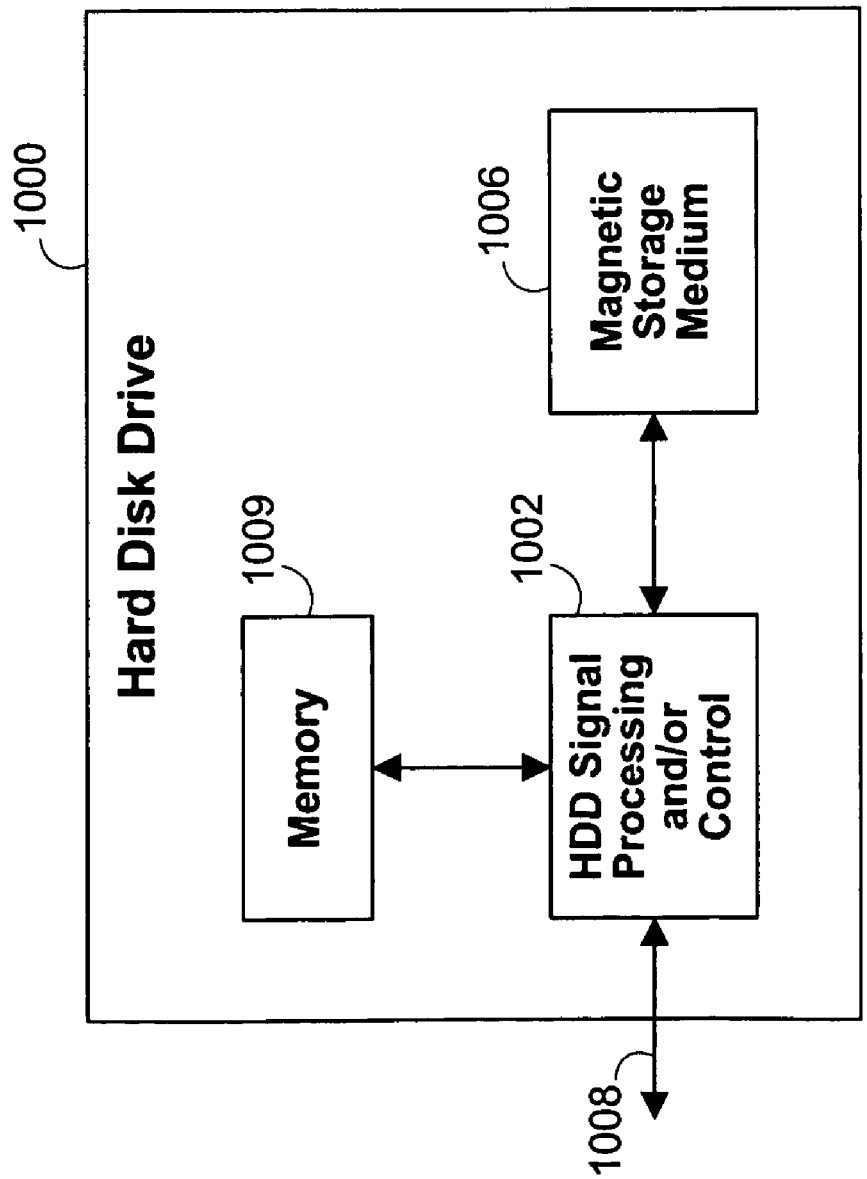
FIG. 13A is a block diagram of an exemplary hard disk drive that can employ the disclosed technology.

Referring now to FIG. 13A, the present invention can be implemented in a hard disk drive 1000. The present invention may implement either or both signal processing and/or control circuits, which are generally identified in FIG. 13A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 13B:
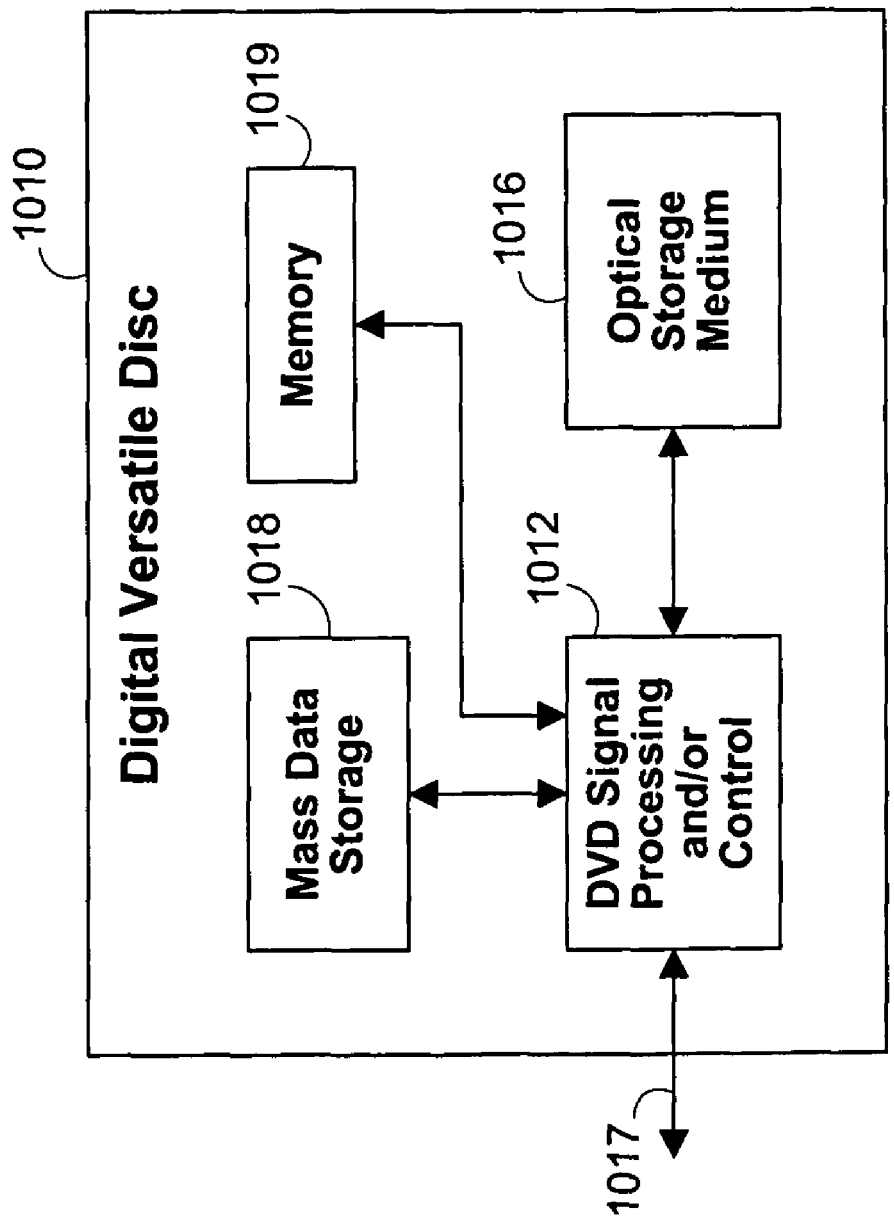
FIG. 13B is a block diagram of an exemplary digital versatile disc that can employ the disclosed technology.

Referring now to FIG. 13B, the present invention can be implemented in a digital versatile disc (DVD) drive 1010. The present invention may implement either or both signal processing and/or control circuits, which are generally identified in FIG. 13B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 13A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 13C:
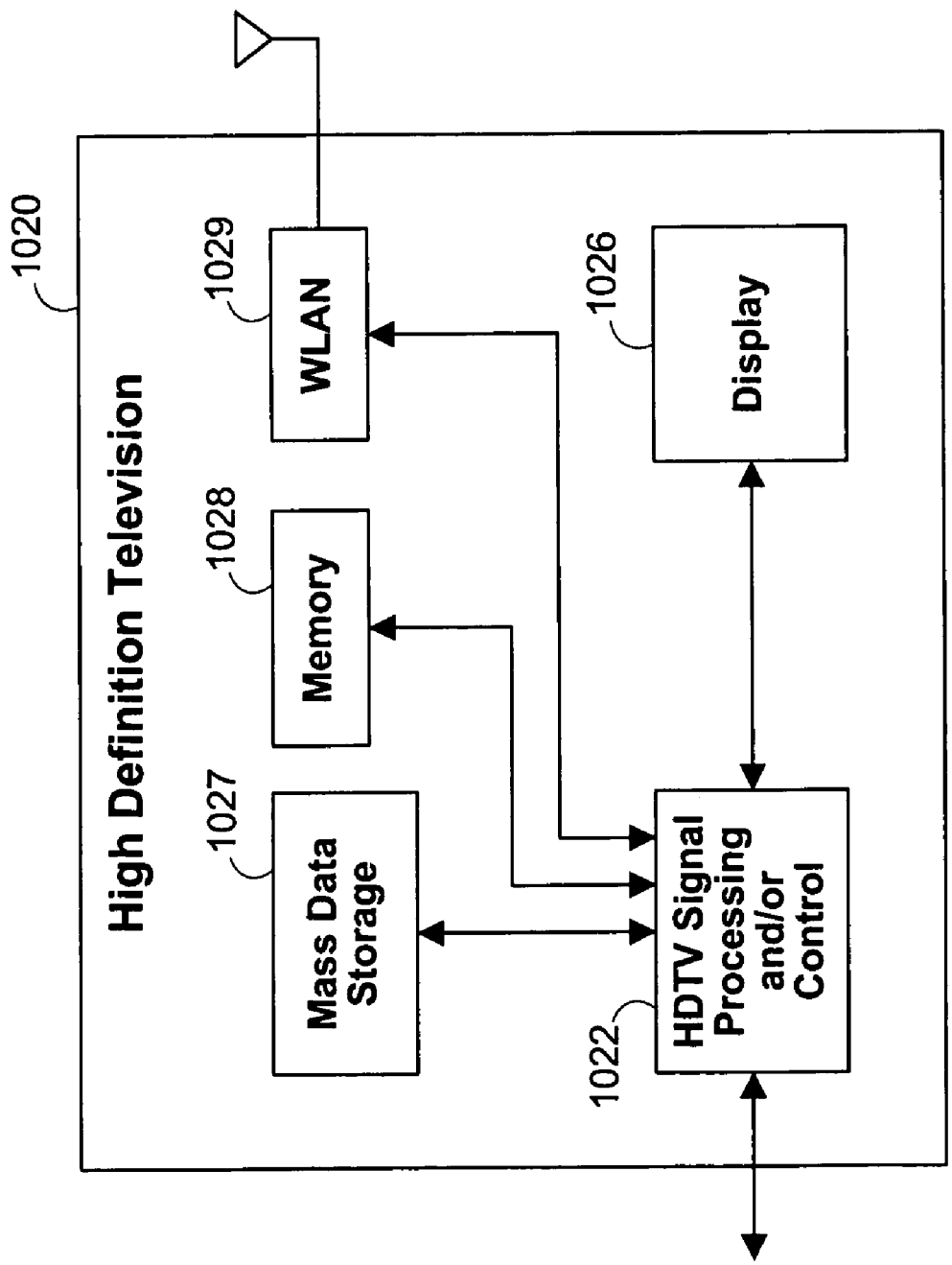
FIG. 13C is a block diagram of an exemplary high definition television that can employ the disclosed technology.

Referring now to FIG. 13C, the present invention can be implemented in a high definition television (HDTV) 1020. The present invention may implement either or both signal processing and/or control circuits, which are generally identified in FIG. 13C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 13A and/or at least one DVD may have the configuration shown in FIG. 13B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 13D:
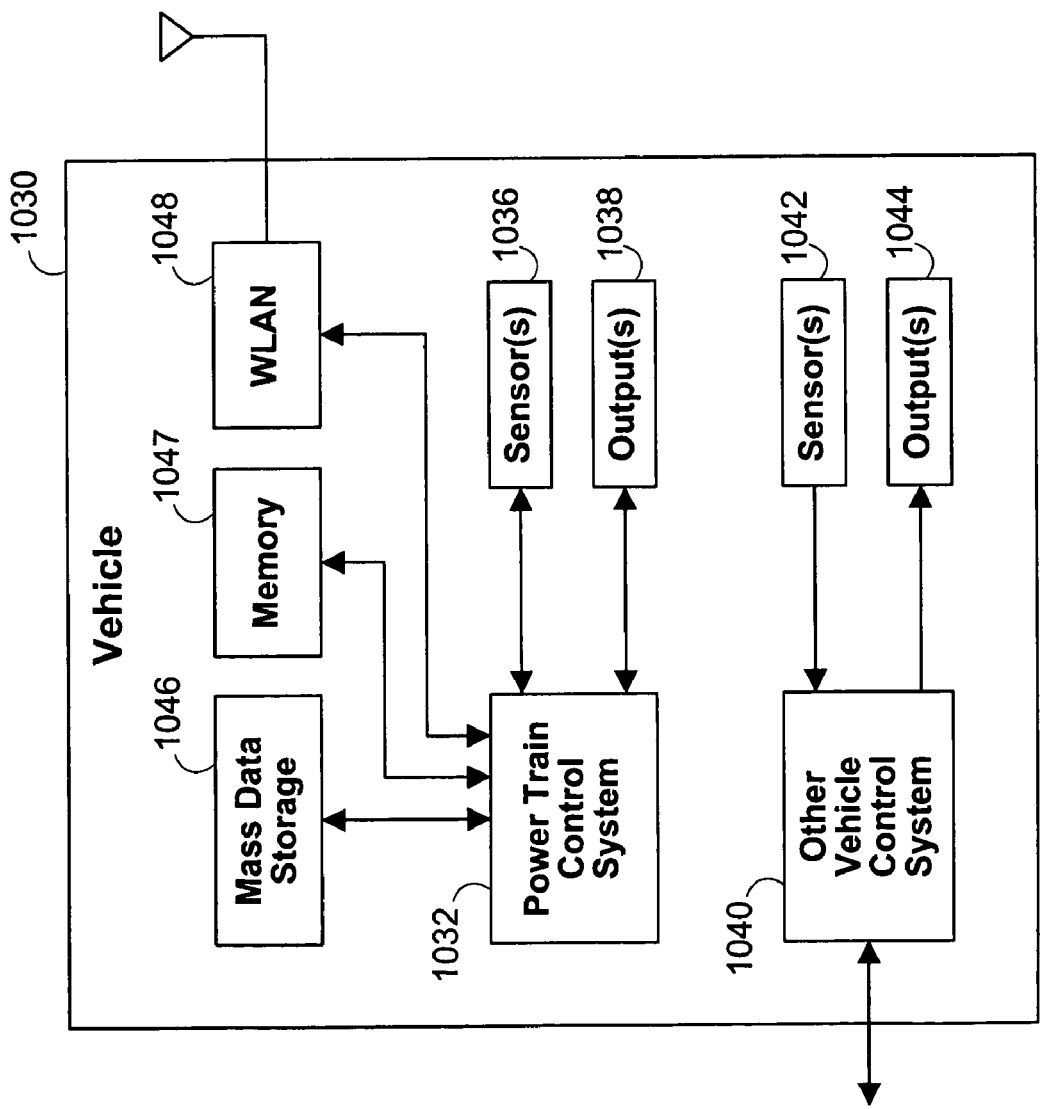
FIG. 13D is a block diagram of an exemplary vehicle that can employ the disclosed technology.

Referring now to FIG. 13D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 13E:
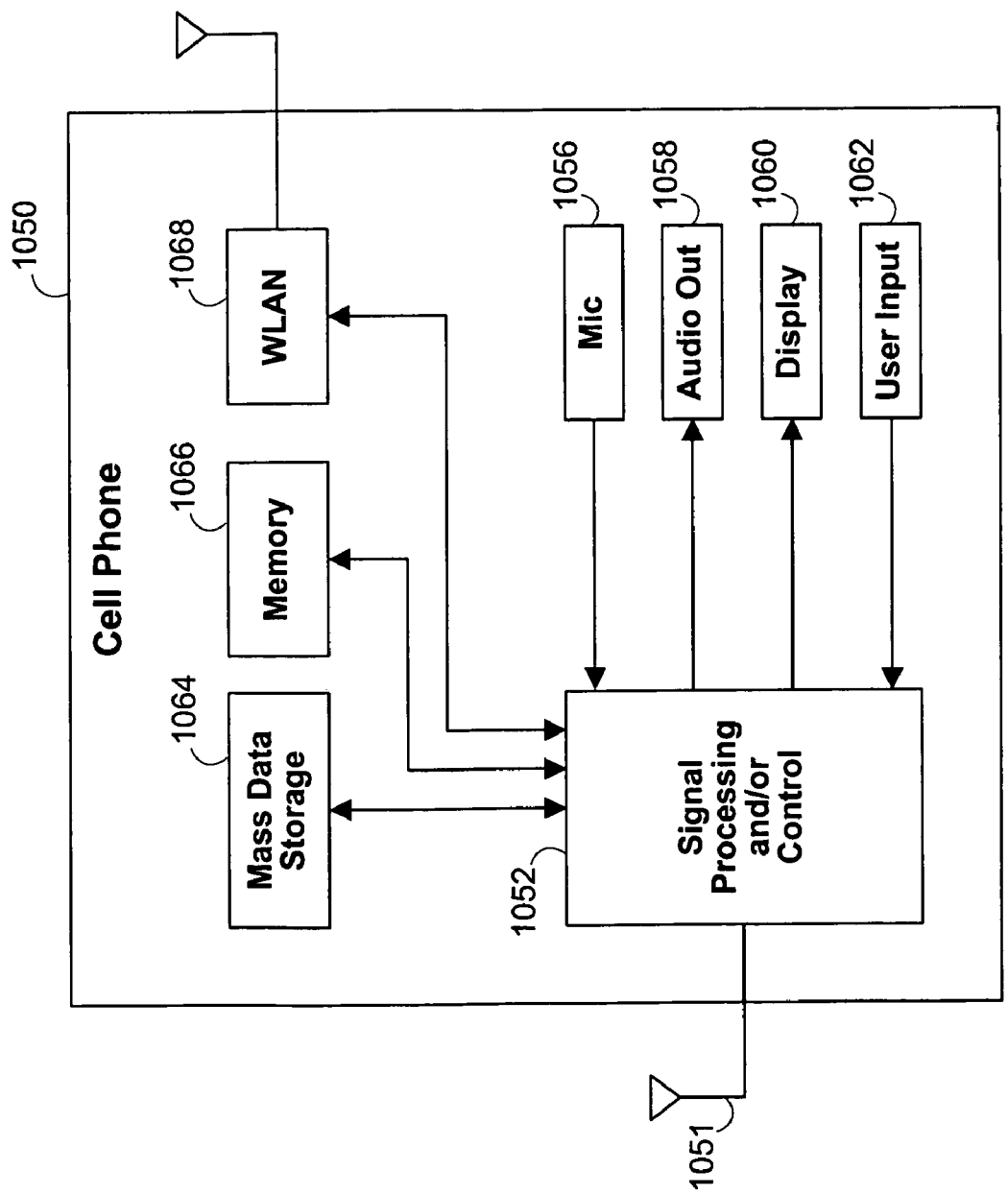
FIG. 13E is a block diagram of an exemplary cell phone that can employ the disclosed technology.

Referring now to FIG. 13E, the present invention can be implemented in a cellular phone 1050 that may include a cellular antenna 1051. The present invention may implement either or both signal processing and/or control circuits, which are generally identified in FIG. 13E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 13F:
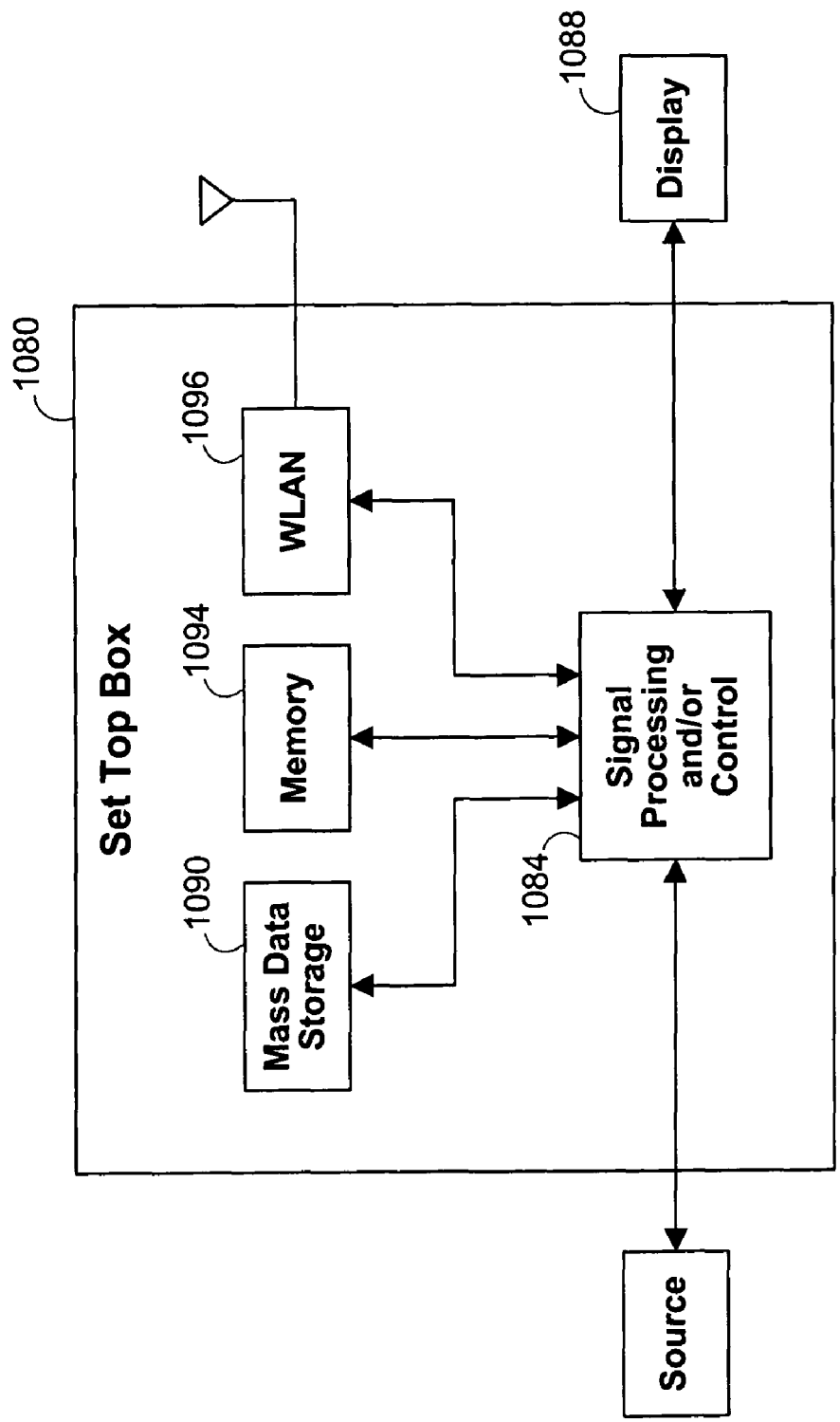
FIG. 13F is a block diagram of an exemplary set top box that can employ the disclosed technology.

Referring now to FIG. 13F, the present invention can be implemented in a set top box 1080. The present invention may implement either or both signal processing and/or control circuits, which are generally identified in FIG. 13F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 13G:
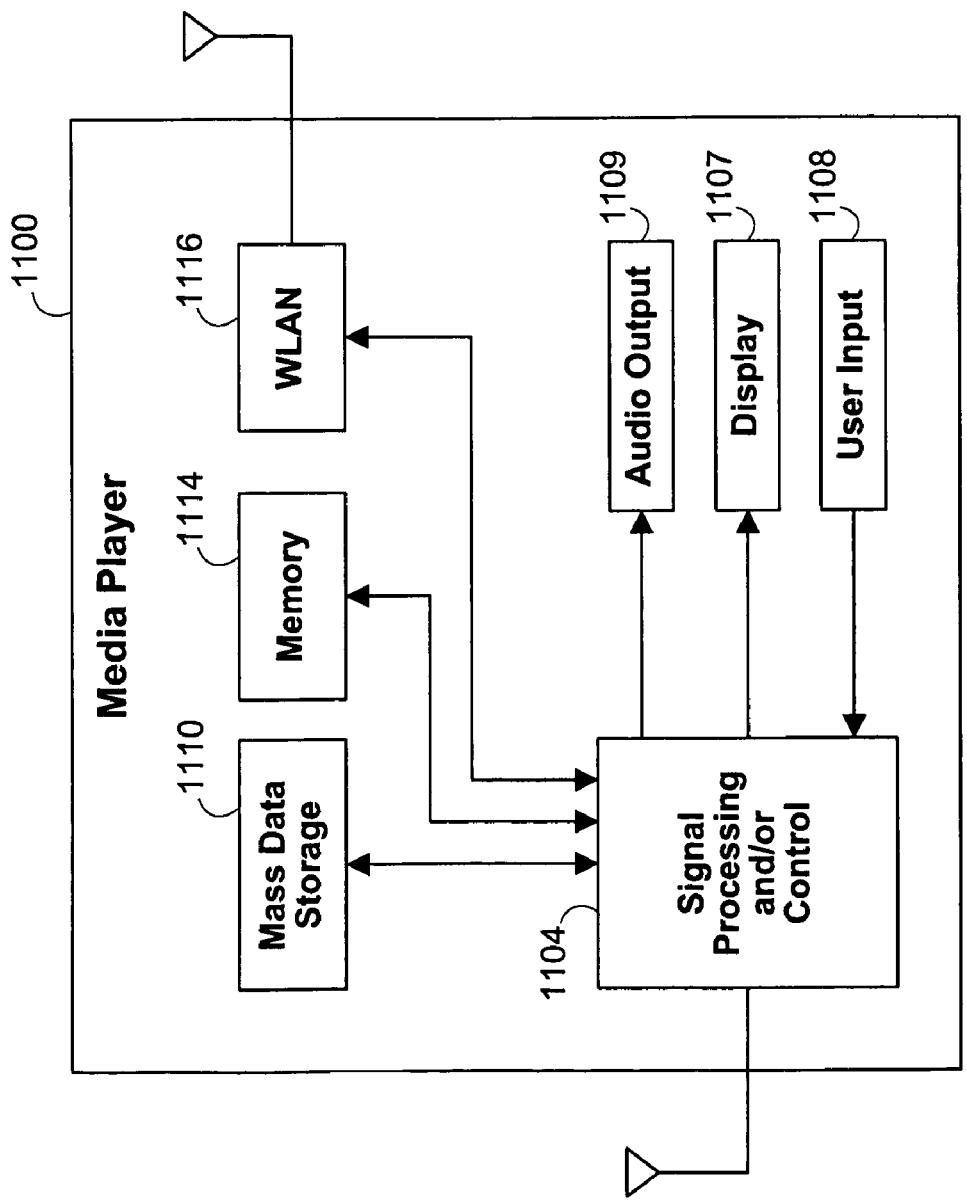
FIG. 13G is a block diagram of an exemplary media player that can employ the disclosed technology.

Referring now to FIG. 13G, the present invention can be implemented in a media player 1100. The present invention may implement either or both signal processing and/or control circuits, which are generally identified in FIG. 13G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described thus far is a less resource intensive way to approximate the result of iterative LDPC decoding. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A method for generating soft information for a variable node from a check node to decode a parity check code, wherein the check node is associated with other co-constraint nodes, the method comprising:
    accessing soft information from the co-constraint nodes;
    determining a first component-wise minimum and a second component-wise minimum based on the soft information;
    forming combinations of the first component-wise minimum and the second component-wise minimum; and
    computing soft information for the variable node based on the combinations.

2. The method of claim 1, wherein the steps of accessing, determining, forming, and computing are repeated until the variable node corresponds to a valid codeword.

3. The method of claim 1, wherein the steps of accessing, determining, forming, and computing are repeated a predetermined number of times.

4. The method of claim 1, further comprising generating soft information for each of the co-constraint nodes associated with the check node.

5. The method of claim 1, wherein accessing soft information from the co-constraint nodes comprises:
    receiving log-ratio messages for the co-constraint nodes;
    converting the log-ratio messages into metric forms; and
    permuting the metric forms into permuted metric forms.

6. The method of claim 5, wherein in the metric form a minimum value corresponds to a most likely value of the co-constraint node.

7. The method of claim 1, wherein determining the first component-wise minimum and the second component-wise minimum further comprises determining corresponding co-constraint nodes of the first component-wise minimum and the second component-wise minimum.

8. The method of claim 1, wherein forming combinations of the first component-wise minimum and the second component-wise minimum comprises forming a set of candidate check node to variable node messages.

9. The method of claim 1, wherein forming combinations of the first component-wise minimum and the second component-wise minimum comprises selecting soft information that corresponds to non-most-likely values for the co-constraint nodes.

10. The method of claim 1, wherein computing soft information for the variable node based on the combinations comprises determining at least a first minimum, a second minimum, and a third minimum from the combinations.

11. The method of claim 10, further comprising computing sets of permuted variable nodes associated with the first minimum and the second minimum.

12. The method of claim 1, further comprising updating the variable node based on the computed soft information.

13. The method of claim 1, further comprising:
determining at least one additional component-wise minimum based on the soft information;
forming combinations of the first component-wise minimum, the second component-wise minimum, and the at least one additional component-wise minimum; and
computing soft information for the variable node based on the combinations.

14. The method of claim 1, further comprising generating soft information for the check node from the variable node and the co-constraint nodes.

15. A system for generating soft information for a variable node from a check node to decode a parity check code, wherein the check node is associated with other co-constraint nodes, the system comprising:
circuitry that accesses soft information from the co-constraint nodes;
circuitry that determines a first component-wise minimum and a second component-wise minimum based on the soft information;
circuitry that forms combinations of the first component-wise minimum and the second component-wise minimum; and
circuitry that computes soft information for the variable node based on the combinations.

16. The system of claim 15, wherein the circuitry that accesses, determines, forms, and computes is used repeatedly until the variable node corresponds to a valid codeword.

17. The system of claim 15, wherein the circuitry that accesses, determines, forms, and computes is used repeatedly for a predetermined number of times.

18. The system of claim 15, further comprising circuitry that generates soft information for each of the co-constraint nodes associated with the check node.

19. The system of claim 15, wherein the circuitry that accesses soft information from the co-constraint nodes comprises:
circuitry that receives log-ratio messages for the co-constraint nodes;
circuitry that converts the log-ratio messages into metric forms; and
circuitry that permutes the metric forms into permuted metric forms.

20. The system of claim 19, wherein in the metric form a minimum value corresponds to a most likely value of the co-constraint node.

21. The system of claim 15, wherein the circuitry that determines the first component-wise minimum and the second component-wise minimum further comprises circuitry that determines corresponding co-constraint nodes of the first component-wise minimum and the second component-wise minimum.

22. The system of claim 15, wherein the circuitry that forms combinations of the first component-wise minimum and the second component-wise minimum comprises circuitry that forms a set of candidate check node to variable node messages.

23. The system of claim 15, wherein the circuitry that forms combinations of the first component-wise minimum and the second component-wise minimum comprises circuitry that selects soft information that corresponds to non-most-likely values for the co-constraint nodes.

24. The system of claim 15, wherein the circuitry that computes soft information for the variable node based on the combinations comprises circuitry that determines at least a first minimum, a second minimum, and a third minimum from the combinations.

25. The system of claim 24, further comprising circuitry that computes sets of permuted variable nodes associated with the first minimum and the second minimum.

26. The system of claim 15, further comprising circuitry the updates the variable node based on the computed soft information.

27. The system of claim 15, further comprising:
circuitry that determines at least one additional component-wise minimum based on the soft information;
circuitry that forms combinations of the first component-wise minimum, the second component-wise minimum, and the at least one additional component-wise minimum; and
circuitry that computes soft information for the variable node based on the combination.

28. The system of claim 15, further comprising circuitry that generates soft information for the check node from the variable node and the co-constraint nodes.

29. A system for generating soft information for a variable node from a check node to decode a parity check code, wherein the check node is associated with other co-constraint nodes, the system comprising:
means for accessing soft information from the co-constraint nodes;
means for determining a first component-wise minimum and a second component-wise minimum based on the soft information;
means for forming combinations of the first component-wise minimum and the second component-wise minimum; and
means for computing soft information for the variable node based on the combinations.

30. The system of claim 29, wherein the means for accessing, determining, forming, and computing are repeated until the variable node corresponds to a valid codeword.

31. The system of claim 29, wherein the means for accessing, determining, forming, and computing are repeated a predetermined number of times.

32. The system of claim 29, further comprising means for generating soft information for each of the co-constraint nodes associated with the check node.

33. The system of claim 29, wherein the means for accessing soft information from the co-constraint nodes comprises:

means for receiving log-ratio messages for the co-constraint nodes;
means for converting the log-ratio messages into metric forms; and
means for permuting the metric forms into permuted metric forms.

34. The system of claim 33, wherein in the metric form a minimum value corresponds to a most likely value of the co-constraint node.

35. The system of claim 29, wherein the means for determining the first component-wise minimum and the second component-wise minimum further comprises means for determining corresponding co-constraint nodes of the first component-wise minimum and the second component-wise minimum.

36. The system of claim 29, wherein the means for forming combinations of the first component-wise minimum and the second component-wise minimum comprises means for forming a set of candidate check node to variable node messages.

37. The system of claim 29, wherein the means for forming combinations of the first component-wise minimum and the second component-wise minimum comprises means for selecting soft information that corresponds to non-most-likely values for the co-constraint nodes.

38. The system of claim 29, wherein the means for computing soft information for the variable node based on the combinations comprises means for determining at least a first minimum, a second minimum, and a third minimum from the combinations.

39. The system of claim 38, further comprising means for computing sets of permuted variable nodes associated with the first minimum and the second minimum.

40. The system of claim 29, further comprising means for updating the variable node based on the computed soft information.

41. The system of claim 29, further comprising:
means for determining at least one additional component-wise minimum based on the soft information;
means for forming combinations of the first component-wise minimum, the second component-wise minimum, and the at least one additional component-wise minimum; and
means for computing soft information for the variable node based on the combination.

42. The system of claim 29, further comprising means for generating soft information for the check node from the variable node and the co-constraint nodes.

* * * * *